(12) United States Patent
Kho

(10) Patent No.: US 10,368,435 B2
(45) Date of Patent: Jul. 30, 2019

(54) SYSTEMS AND METHODS FOR BREADBOARD STYLE PRINTED CIRCUIT BOARD

(71) Applicant: Samuel P. Kho, Mountain View, CA (US)

(72) Inventor: Samuel P. Kho, Mountain View, CA (US)

( * ) Notice: Subject to any disclaimer, the term of this patent is extended or adjusted under 35 U.S.C. 154(b) by 0 days.

(21) Appl. No.: 15/173,408

(22) Filed: Jun. 3, 2016

(65) Prior Publication Data

US 2016/0360613 A1    Dec. 8, 2016

Related U.S. Application Data

(60) Provisional application No. 62/171,554, filed on Jun. 5, 2015.

(51) Int. Cl.
*H05K 1/02* (2006.01)
*H05K 1/11* (2006.01)
(Continued)

(52) U.S. Cl.
CPC ........... *H05K 1/0289* (2013.01); *H05K 1/029* (2013.01); *H05K 1/0286* (2013.01); *H05K 1/0292* (2013.01); *H05K 1/0293* (2013.01); *H05K 1/11* (2013.01); *H05K 1/0215* (2013.01); *H05K 1/0269* (2013.01); *H05K 1/09* (2013.01); *H05K 3/1216* (2013.01); *H05K 2201/0305* (2013.01); *H05K 2201/09254* (2013.01);
(Continued)

(58) Field of Classification Search
CPC .......... H05K 1/0286; H05K 1/11; H05K 3/40; H05K 1/09; H05K 3/4007; H05K 3/0073; H05K 2201/09209
See application file for complete search history.

(56) References Cited

U.S. PATENT DOCUMENTS

D228,136 S    8/1973 Portugal et al.
3,824,433 A *  7/1974 Newton, Jr. ......... H05K 1/0289
                                                       174/254
(Continued)

OTHER PUBLICATIONS

International Search Report dated Sep. 2, 2016, in International PCT Patent Application No. PCT/US2016/035907, filed Jun. 3, 2016 (2pgs).
(Continued)

*Primary Examiner* — Ishwarbhai B Patel
(74) *Attorney, Agent, or Firm* — North Weber & Baugh LLP

(57) ABSTRACT

The present invention relates generally to electric circuit testing, building, or implementing using a breadboard style PCB. Aspects of the present invention include eliminating the need to use hookup wires when building and testing electric circuits on PCBs. In embodiments, a PCB system having rows and columns of signal tie points connected in a breadboard layout and using an embedded wire and a solder bridge to form partial connections between signal tie points. In embodiments, the embedded wire and solder bridge is capable of connecting a column of signal tie points. In embodiments, the embedded wire and solder bridge is capable of connecting a power rail to a signal tie point. Thus, a circuit can be implemented and tested by applying a small amount of solder to the solder bridge without the need for hookup wires.

12 Claims, 23 Drawing Sheets

(51) Int. Cl.
　　　*H05K 1/09*　　　(2006.01)
　　　*H05K 3/12*　　　(2006.01)

(52) U.S. Cl.
　　　CPC .............. *H05K 2201/09563* (2013.01); *H05K 2201/09572* (2013.01); *H05K 2201/09609* (2013.01); *H05K 2203/166* (2013.01)

(56) References Cited

U.S. PATENT DOCUMENTS

| | | | |
|---|---|---|---|
| 4,330,684 A | | 5/1982 | Hayward |
| 4,772,864 A | | 9/1988 | Otto et al. |
| 4,982,892 A | * | 1/1991 | Parla ................. B23K 37/06 |
| | | | 174/261 |
| 5,360,948 A | * | 11/1994 | Thornberg ............ H01L 21/485 |
| | | | 174/250 |
| 5,544,018 A | * | 8/1996 | Sommerfeldt ...... H01L 23/5382 |
| | | | 257/E23.171 |
| 6,341,417 B1 | | 1/2002 | Gupta et al. |
| 6,650,548 B1 | * | 11/2003 | Swetland ................ G09B 23/18 |
| | | | 361/777 |
| 6,664,482 B1 | * | 12/2003 | Shaeffer ............... H05K 1/0293 |
| | | | 174/256 |
| 7,199,304 B2 | * | 4/2007 | Wienrich ............ H01L 23/5382 |
| | | | 174/254 |
| 7,411,134 B1 | | 8/2008 | Steinfeld et al. |
| 7,425,684 B2 | * | 9/2008 | Ta ........................ H05K 1/0287 |
| | | | 174/255 |

OTHER PUBLICATIONS

Written Opinion of Sep. 2, 2016, in International PCT Patent Application No. PCT/US2016/035907, filed Jun. 3, 2016 (6pgs).

\* cited by examiner

SYSTEMS AND METHODS FOR BREADBOARD STYLE PRINTED CIRCUIT BOARD

CROSS-REFERENCE TO RELATED APPLICATION

This patent application claims priority to commonly-owned U.S. Pat. App. No. 62/171,554, filed on Jun. 5, 2015, entitled "Breadboard-style Printed Circuit Board with reduced or eliminated need of Hookup Wires," and listing Samuel P. Kho as inventor, which patent document is incorporated by reference herein in its entirety and for all purposes.

BACKGROUND

Field of Invention

The present invention relates generally to printed circuit boards and more particularly to protoboards with a bread board style layout.

Description of the Related Art

Often when designing a circuit or creating a circuit engineers and home hobbyists use a breadboard to test the circuit. A breadboard is a board made of plastic with plastic holes to insert electronic components and wires. A breadboard consists of a perforated block of plastic with numerous tin plated phosphor bronze or nickel silver alloy spring clips under the perforations. The clips are often called tie points or contact points. The number of tie points is often given in the specification of the breadboard. Beneath the plastic holes is a circuit board having a specific layout. The layout is typically comprised of rows and columns of the tie points. Typically, the columns will be divided in half, a left half and a right half, where each hole in a row of the left half will be internally connected to the other tie points in that half column. The right half is similar. Also, there are typically power rails, where one column is powered and one is grounded.

A wire can be used to connect the power rail to any other hole. Also, integrated circuit (IC) chips can be used and placed across the left and right halves. Using a breadboard, a circuit can be built, tested, and modified without having to solder chips and other components to a printed circuit board. However, using a breadboard can be tedious and time consuming. Each wire has to be cut and striped. Even in a simple circuit that process is cumbersome, but in a complex circuit, that process takes a significant amount of time to form the connections between the parts of the breadboard that already have internal connections.

After a circuit has been tested and proven, it can be transferred to a breadboard style printed circuit board (PCB). A breadboard style PCB has similar interconnects to a breadboard, but is a PCB. The components can be transferred easily from the breadboard preserving the layout of the circuit. The components and the hookup wires are soldered to the PCB. The soldering makes the attachment more permanent. However, the hookup wires still need to be cut, striped and soldered to the PCB, which is a laborious process.

FIG. 1 shows a breadboard-style PCB in perspective view, but with the bottom copper layer exploded. PCB 99 is the board with two-sided copper layers. The top layer has holes similar to the holes on a breadboard called plated-through-holes (PTHs). The top layer PTHs are electrically connected to the bottom layer PTHs similar to the tie points in the breadboard example.

In a breadboard style PCB, the PCB layout is similar to the breadboard layout having rows and columns of PTHs that are electrically connected horizontally and divided into a left half and a right half. Also, similarly the breadboard style PCB can have a power column referred to as a power rail and a ground column referred to as a ground rail.

In FIG. 1, PTHs 1, 2, 3, 4, 5 on the bottom copper layer correspond with and are electrically connected to the PTHs 11, 12, 13, 14, 15, respectively, on the top copper layer. Power rail 66 is a copper trace connecting 1 and 2 vertically. Power rails 67, 68, 69 are additional power rails. By convention, power rails 66 and 68 are used as negative (ground) rails, while 67 and 69 are used as positive rails. Copper traces 77 and 78 are copper traces connecting PTHs 3, 4, and 5, which form a signal tie: a component lead soldered to 3 is electrically connected to component lead soldered to 4 or 5.

For ease of explanation and uncluttering of the figure not all PTHs are labeled however, the top and bottom layer corresponding PTHs are electrically connected as described above for each PTH. For example, power rail 69 corresponds to power rail 59. Power rail 59 is comprised of PTHs 51, 52, 53, 54, 55, and 56. Similarly, power rail 58 corresponds to power 68. Power rail 58 is comprised of PTHs 41, 42, 43, 44, 45, and 46. Also, the right portion of the rows are labeled and the left portion are connected in a similar configuration. PTHs 21, 22, 23 form a right portion of row 1 and are electrically connected to each other by way of the bottom copper layer shown as 74 and 75. PTH 31, 32, and 33 form the right portion of row 2 and are electrically connected to each other by way of the bottom layer shown as 72 and 73. The rest of the rows are configured similarly to row N.

Signal ties are arranged horizontally, in two banks of parallel rows. Hookup wires (not shown) are used to electrically connect separate signal ties, or to electrically connect a signal tie to a power rail. The term signal tie point is used herein interchangeably with PTH.

As shown in FIG. 1, a breadboard style printed circuit board may be implemented with a printed circuit board stack-up, without need for solder mask or silkscreen.

However, with the prior art PCB, hookup wires must be used to form connections between power rails and between PTHs that are not electrically connected.

Accordingly, what is needed is to overcome the limitations of using wires with breadboards and over the limitations of soldering hookup wire connections using PCBs. A hookup wire requires cutting, stripping and soldering the wire.

BRIEF DESCRIPTION OF THE DRAWINGS

Reference will be made to embodiments of the invention, examples of which may be illustrated in the accompanying figures, in which like parts may be referred to by like or similar numerals. These figures are intended to be illustrative, not limiting. Although the invention is generally described in the context of these embodiments, it should be understood that it is not intended to limit the spirit and scope of the invention to these particular embodiments. These drawings shall in no way limit any changes in form and detail that may be made to the invention by one skilled in the art without departing from the spirit and scope of the invention.

DESCRIPTION OF THE PREFERRED EMBODIMENTS

Figure 1:
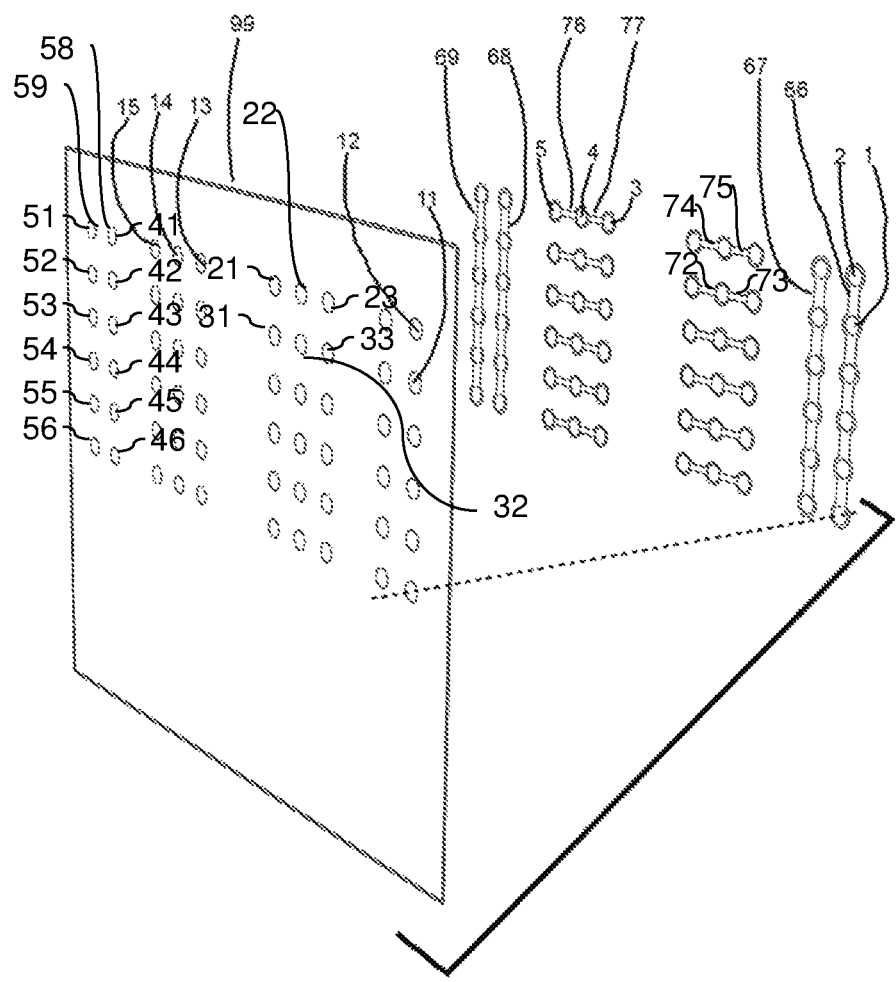
FIG. 1 depicts a perspective view of a prior art breadboard style PCB according to embodiments in this patent document.

In the following description, for purposes of explanation, specific details are set forth in order to provide an understanding of the invention. It will be apparent, however, to one skilled in the art that the invention can be practiced without these details. Furthermore, one skilled in the art will recognize that embodiments of the present invention, described below, may be implemented in a variety of ways, such as a process, an apparatus, a system, a device, or a method on a tangible computer-readable medium.

Components, or modules, shown in diagrams are illustrative of exemplary embodiments of the invention and are meant to avoid obscuring the invention. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," "electrically connected" or "electrically coupled" shall be understood to include direct connections and indirect connections through one or more intermediary devices.

Reference in the specification to "one embodiment," "preferred embodiment," "an embodiment," or "embodiments" means that a particular feature, structure, characteristic, or function described in connection with the embodiment is included in at least one embodiment of the invention and may be in more than one embodiment. Also, the appearances of the above-noted phrases in various places in the specification are not necessarily all referring to the same embodiment or embodiments.

The use of certain terms in various places in the specification is for illustration and should not be construed as limiting.

Furthermore, it shall be noted that: (1) certain steps may optionally be performed; (2) steps may not be limited to the specific order set forth herein; (3) certain steps may be performed in different orders; and (4) certain steps may be done concurrently.

The present invention relates in various embodiments to devices, systems, methods, and instructions stored on one or more non-transitory computer-readable media involving the communication of data over networks. Such devices, systems, methods, and instructions stored on one or more non-transitory computer-readable media can result in, among other advantages, the reduction or elimination of hookup wires.

It shall also be noted that although embodiments described herein may be within the context of an improved breadboard style printed circuit board, the invention elements of the current patent document are not so limited. Accordingly, the invention elements may be applied or adapted for use in other contexts.

The present breadboard style printed circuit board can use the same layout as prior art breadboards. It is advantageous to maintain the same layout as breadboards and as prior art PCBs so that a circuit designer can still design a circuit using a breadboard before transferring it to a PCB. Therefore, the configuration of plated through holes or signal tie points remains the same as in FIG. 1.

The term signal tie point is used herein interchangeably with PTH. The term signal tie point is typically used with respect to breadboards, whereas PTH is typically used with respect to a PCB, and refers to a hole in fiberglass where the hole has been metallized and then further plated. It is PTH that makes the top and bottom copper aligned holes connected. However, signal tie points are implemented as PTHs in a PCB. Therefore, in the context of the disclosure herein, the terms PTH and signal tie point are used interchangeably. The term signal tie refers to the electrical connection between signal tie points or PTHs.

In embodiments, the PCB 200 can have a plurality of rows and columns of signal tie points. Each row can be divided into a left portion and a right portion. Each signal tie point in the left portion of a particular row is connected to each other signal tie point in the left portion in that row. Similarly for the right portion, each signal tie point in the right portion of a particular row is connected to each signal tie point in the right portion in that row. Also, there are columns, which form power rails, where each signal tie point is connected to each other signal tie point. A power rail can be used to provide power to the PCB or can be as a ground rail.

One of ordinary skill in the art will appreciate that the left portion and right portion of the rows are not electrically connected to each other, for example, signal tie points 213 and 234 are not electrically connected to each other. One of ordinary skill in the art will also appreciate that, with the exception of the power rail columns, the signal tie points in a column are not electrically connected, for example, signal tie points 213 and 216 are not electrically connected to each other. Also, the power rails are not typically connected to each other or any signal tie point.

In embodiments, the connections are electrical connections. The electrical connections can be implemented as signal ties on a bottom copper layer. One of ordinary skill in the art will appreciate that electrical connections can be implemented through methods other than copper and other than on the bottom copper layer.

Figure 2:
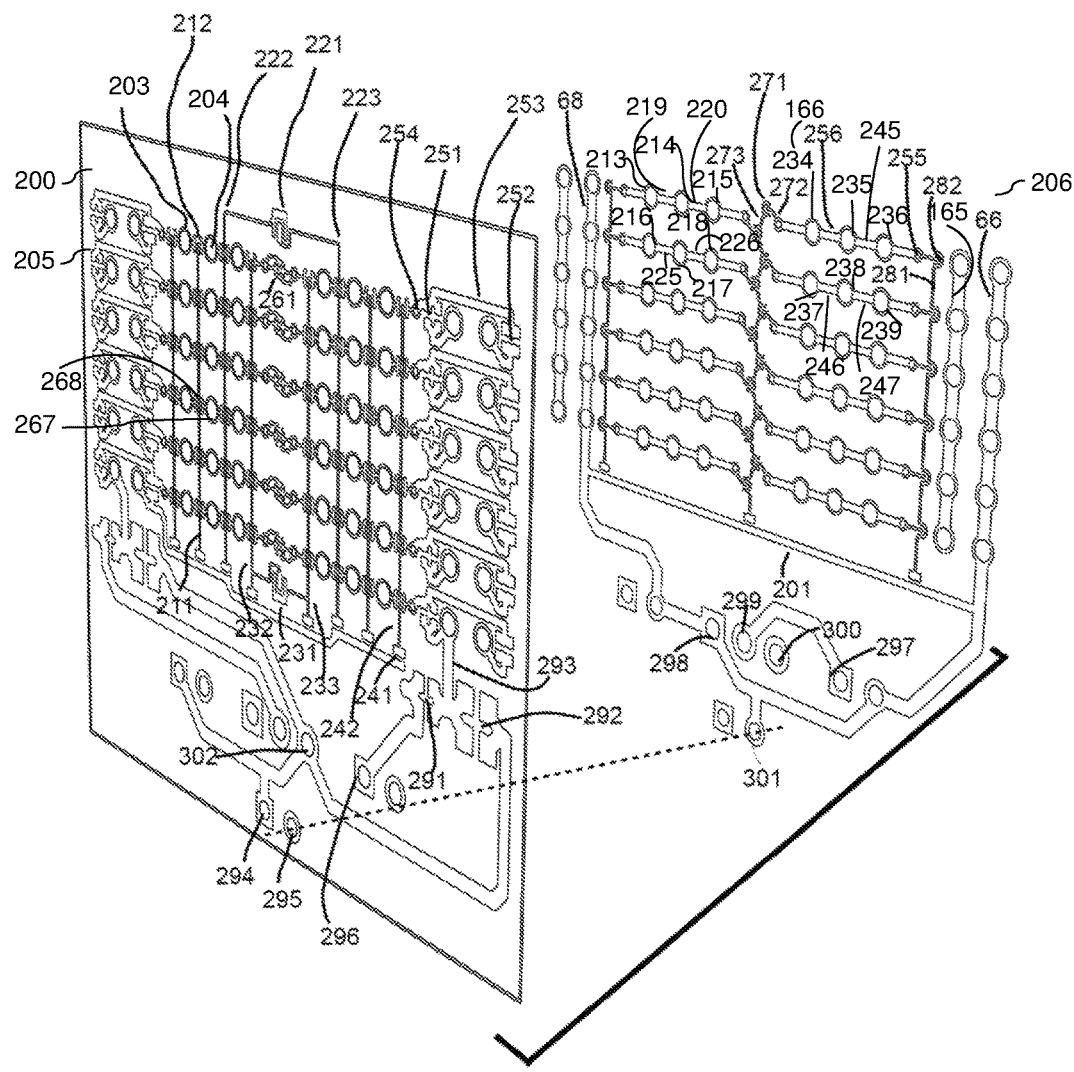
FIG. 2 depicts a perspective view of a top copper layer, board layer, and bottom copper (exploded) layer of a basic style according to embodiments in this patent document.
Figure 3:
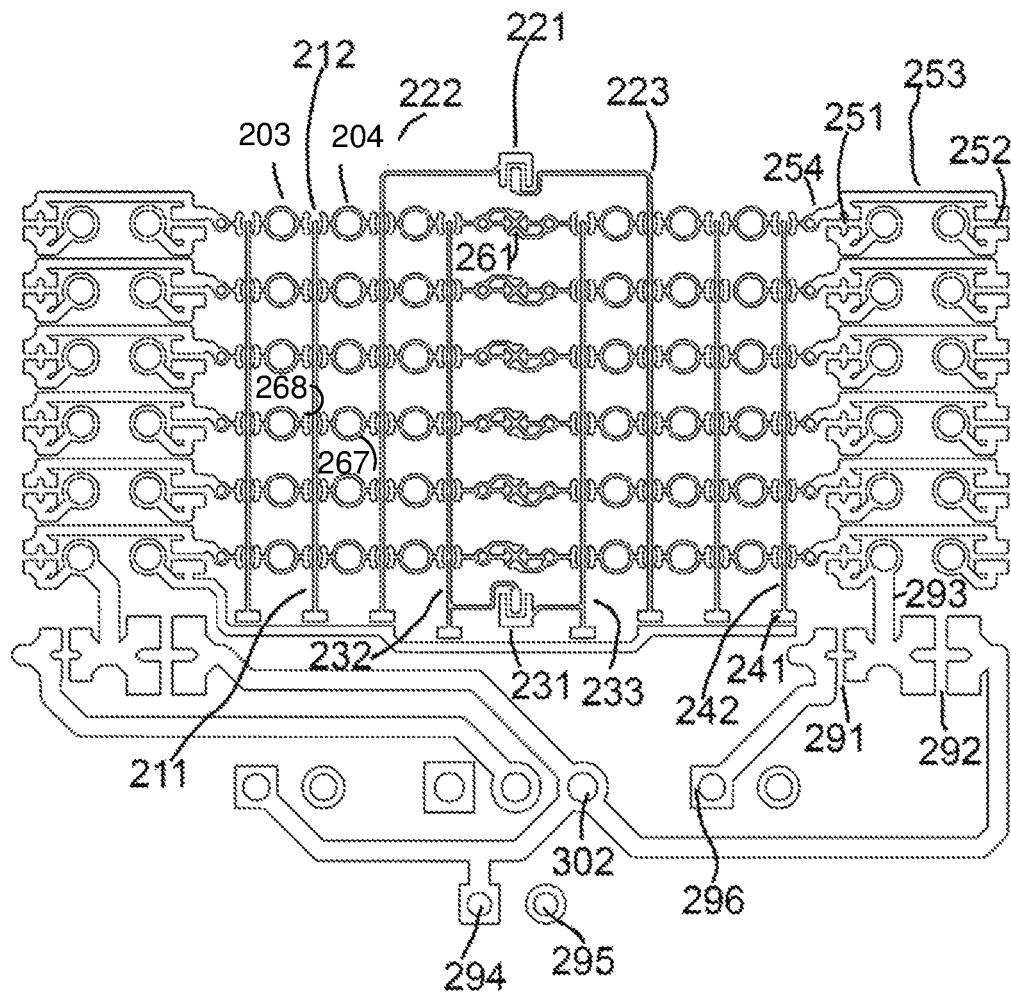
FIG. 3 depicts a top view of a top copper layer according to embodiments in this patent document.
Figure 4:
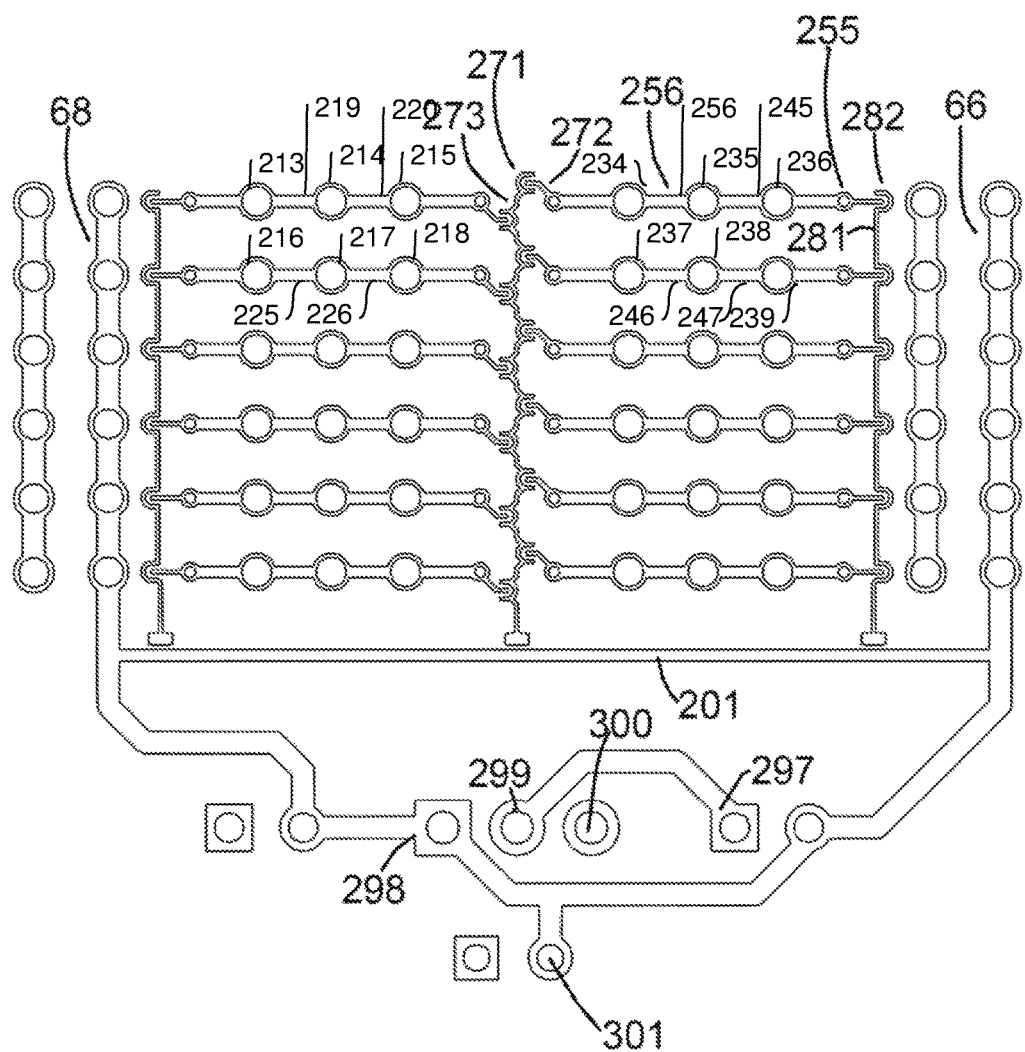
FIG. 4 depicts a top view of a bottom layer according to embodiments in this patent document.

FIGS. 2, 3, and 4 show the top and bottom copper layers according to embodiments described herein. They have the same number of signal ties as FIG. 1 does, and the same number of power rails as FIG. 1 does.

FIG. 2 depicts a perspective view of a top copper layer, board layer, and bottom copper (exploded) layer of a basic style according to embodiments in this patent document. FIG. 2 shows 205, which the is the top copper layer and 206 shows the bottom layer. FIG. 3 depicts a top view of a top copper layer 205 according to embodiments in this patent document. FIG. 4 depicts a top view of a bottom layer 206 according to embodiments in this patent document. The three figures use the same reference numbers and are described together.

For ease of explanation, the bottom layer 206 of the PCB has been labeled. Each signal tie point has a corresponding element on the top layer 205 of the PCB. For example, signal tie point 213 on the bottom layer 206 corresponds to signal tie point 203 on the top layer 205 and signal tie point 214 on the bottom layer 206 corresponds to 204 on the top layer 205. Further, the layout of the signal tie points is the same on each layer. Therefore, the layout will be labeled and described relative to the bottom layer 206. However, one of ordinary skill in the art will appreciate that the signal tie points on the bottom layer 206 have corresponding signal tie points on the top layer 205.

In embodiments, signal tie points 213, 214, and 215 form a left portion of a first row. In embodiments, signal tie points 213, 214, and 215 are electrically connected to each other with electrical connectors 219 and 220. In embodiments, signal tie point 216, 217, and 218 form a left portion of a second row. In embodiments, signal tie points 216, 217, and 218 are electrically connected with electrical connectors 225 and 226. This layout continues through row N. Further, a similar right portion of the first row, second and through row N as has a similar layout, shown in FIG. 2. For example, signal tie points 234, 235, and 236 form a right portion of a first row and are electrically connected using electrical connectors 256 and 245. In embodiments, signal tie points 237, 238, and 239 for the right portion of the second row and are electrically connected with electrical connectors 246 and 247.

In embodiments, an embedded wire and a solder bridge can be used to make commonly used connections. In embodiments, an embedded wire and a solder bridge can be implemented in a variety of different ways. An embedded wire and a solder bridge can be implemented on the top layer or the bottom layer. An embedded wire and a solder bridge can be implemented using a copper layer in any layer. An embedded wire and a solder bridge form connections that are not fully made, but can be completed using a small amount of solder.

In embodiments, an embedded wire and a solder bridge can be used to make common connections easy for a designer to make without the need for hookup wires. For example, embedded wires and solder bridges can be used to connect rows together on one portion (right or left) of the PCB. In embodiments, embedded wires and solder bridges can also be used to connect the right portion of the board to the left portion of the board. In embodiments, embedded wires and solder bridges can also be used to connect power rails to each other.

Since embedded wires and solder bridges do not form full connections, they provide flexibility to the circuit designer without the need for the circuit designer to spend the time cutting, stripping, and soldering hookup wires. With a small amount of solder or solder paste, the solder bridges can form full connections.

The solder bridges can be soldered manually with solder wire. Solder wire of 0.010" diameter work especially well. One of ordinary skill in the art will recognize that soldering will likely be done with magnification.

The solder bridges can also be soldered by using solder paste, dispensed manually, and directly, onto a solder bridge. The solder paste may be soldered with a heat gun, with the temperature of the heat gun manually adjusted to simulate the desired temperature profile of the solder paste. In embodiments, an oven can be used for soldering the solder paste.

The solder bridges can also be soldered using a stencil or template.

Embedded wires can be used to make partial connections for each column. For example, embedded wires 211, 222, 223, 233, and 242 are shown. While the embedded wires are shown in top layer 205, they do not have to be implemented on the top layer 205. One of ordinary skill in the art will appreciate that any column can use a partial connection or an embedded to form a connection between any two signal tie points in the column. The partial connection is turned into a full connection by applying solder to a solder bridge. For example, solder bridge 212 forms a connection between signal tie points 203 and 204 (which are already electrically connecting using signal ties, and any other signal tie points on those columns. For example, signal tie points 203 and 204 can be connected to signal tie point 267 (and its other signal tie point in its row) by applying solder to solder bridge 212 and solder bridge 268. Using these embedded wires, many connections can be formed without hookup wires, merely by applying a small amount of solder to a solder bridge.

For example, one common connection is a ground rail connector. In embodiments, ground rail connector 201 is an electrical connector that connects two power rails that are by convention used as ground rails 66 and 68.

In embodiments, embedded wire 211 can be used to connect the signal tie point in a column. For example, embedded wire 211 can run perpendicular to signal ties (the electrical connections between the signal tie points in a row) and parallel to the power rails 66 and 68. In embodiments, embedded wire 211 is a copper trace. Embedded wire 211 can be implemented on a trace opposite the signal ties, e.g., the top layer 205. In the embodiment shown in FIG. 2, embedded wire 211 is shown on the top copper layer 205, running vertically in the columnar gap between two columns of signal tie points.

In embodiments, solder bridge 212 is a partial connector between signal tie points 204 and 205. It need only be connected to one of them since 204 and 203 are part of the same signal tie, but in the drawing is shown as connected to both. Embedded wire 211 runs through the middle of 212 and forms part of the solder bridge 212. There is no electrical connection between 204 and 211 (nor between 203 and 211). However, by applying solder to 212, an electrical connection is made between 204 and 211 (and between 203 and 211). Applying solder to another solder bridge intersecting 211 effectively turns 211 into a hookup wire. Embedded wire 211 runs the entire vertical length of the signal ties, and can connect to any signal tie on the left portion of the PCB.

In embodiments, top global busser 221 is a solder bridge on the top, above the first row of signal tie points, of the PCB. Applying solder to top global busser 221 connects embedded wire 222 and embedded wire 223. Embedded wire 222 can connect to any signal tie on the left portion of the PCB, while embedded wire 223 can connect to any signal tie on the right portion of the PCB. Embedded wire 222 is similar to embedded wire 212 and is capable of connecting any row to any other row on the left portion of the PCB. Embedded wire 223 is similar to embedded wire 212 and 222, but is capable of connecting any rows on the right portion of the PCB. By applying solder to top global busser 221, a connection is made between embedded wires 222 and 223, and embedded wires 222 and 223 together are turned into a global bus. The global bus is capable of connecting to any signal tie, both on the left and right portions of the PCB. In embodiments, a global bus is useful, e.g. for Inter-Integrated Circuit (i2c), signal clock line (SCL), or serial data line (SDA) lines.

In embodiments, bottom global busser 231 is similar to top global busser 221 but is placed in the middle bottom of the PCB. Applying solder to bottom global busser 231 connects embedded wire 232 and embedded wire 233, which together are turned into a global bus. Embedded wires 232 and 233 are similar to embedded wires 223 and 211 and 222, however, they connect a different column to itself.

In embodiments, embedded wire sinker 241 is a solder bridge that with solder applied, connects embedded wire 242 to ground. This embedded wire sinker 241 is useful in case embedded wire 242 is not connected to any signal tie, and is a convenient way to not leave 242 floating.

In embodiments, power bridge 251 and ground bridge 252 are both solder bridges. One side of power bridge 251 can be connected to the power rail 165. One side of ground bridge 252 can be connected to the ground rail 66. The other side of power bridge 251 and the other side of ground bridge 252 can be connected together via trace 253, which is connected to via top copper half 254. This via's bottom half 255 is connected to signal tie point 256. A signal tie point can be connected to power by applying solder to solder bridge 251, or connected to ground by applying solder to solder bridge 252. No hookup wire is needed to connect a signal tie to power or ground. Unused signal tie points can be easily connected to ground (so as to not leave it floating) by applying solder to ground bridges.

Center crosser 261 is a solder bridge that, with solder applied, connects the two signal ties to its left and right portions. It connects the left and right portions for one row. Although only one is labeled, each row can have a center crosser, as shown in FIG. 2.

In embodiments, backbone bridge 271, with solder applied, connects signal tie 256 via solder bridge 271 to backbone bus 273. Backbone bus 273, shown zigzagging (non-zigzag versions can be used as well) and can connect (with solder applied) to every signal tie. Therefore, backbone bus 273 can be used as a global bus.

In embodiments, embedded wire 281 forms a partial connection to signal tie 256 via solder bridge 282. When solder is applied to solder bridge 282, the electrical connection between embedded wire 281 and signal tie 256 is completed. Embedded wire 281 is similar to embedded wire 211 and solder bridge 282 is similar in functionality to solder bridge 212, but embedded wire 281 and solder bridge 282 are shown on the bottom layer of the PCB.

In embodiments, low drop out regulator (LDO) power bridge 291, with solder applied, supplies power to power rail 293. Input power bridge 292, with solder applied, supplies power to power rail 293. Only one of solder bridge 291 or solder bridge 292 should have solder applied. Solder bridge 291 and solder bridge 292 act as a voltage selector for power rail 293, depending on which one has solder applied. Signal tie points 294 and 295 are signal tie points for input headers to be used for power, with signal tie point 294 for positive power input signal tie point 295 for ground. Signal tie point 294 is connected directly to one side of solder bridge 292. Signal tie points 298, 299, and 300 are plated-through-holes for plugging in an LDO (e.g. with transistor outline (TO) TO-220 form factor) with Ground/Output/Input ("GOI") terminals, respectively. Ground 295 is connected via signal tie point 301 to signal tie point 298. Power input 294 is connected to signal tie point 300 via signal tie point 302. LDO output 299 is connected via signal tie point 297 (in the bottom layer) and signal tie point 296 (in the top layer) to half of LDO power bridge 291.

An example configuration (not shown) capable with the embodiments shown in FIG. 2 is to supply 5V input to signal tie point 294, and plug a 3.3V LDO voltage regulator (not shown) into signal tie points 298, 299, 300. With this configuration, if solder is applied to LDO power bridge 291, then power rail 293 will have 3.3V. If instead, solder is applied to input power bridge 292, then power rail 293 will have 5V. No hookup wire is necessary for this selectable power functionality.

Figure 5:
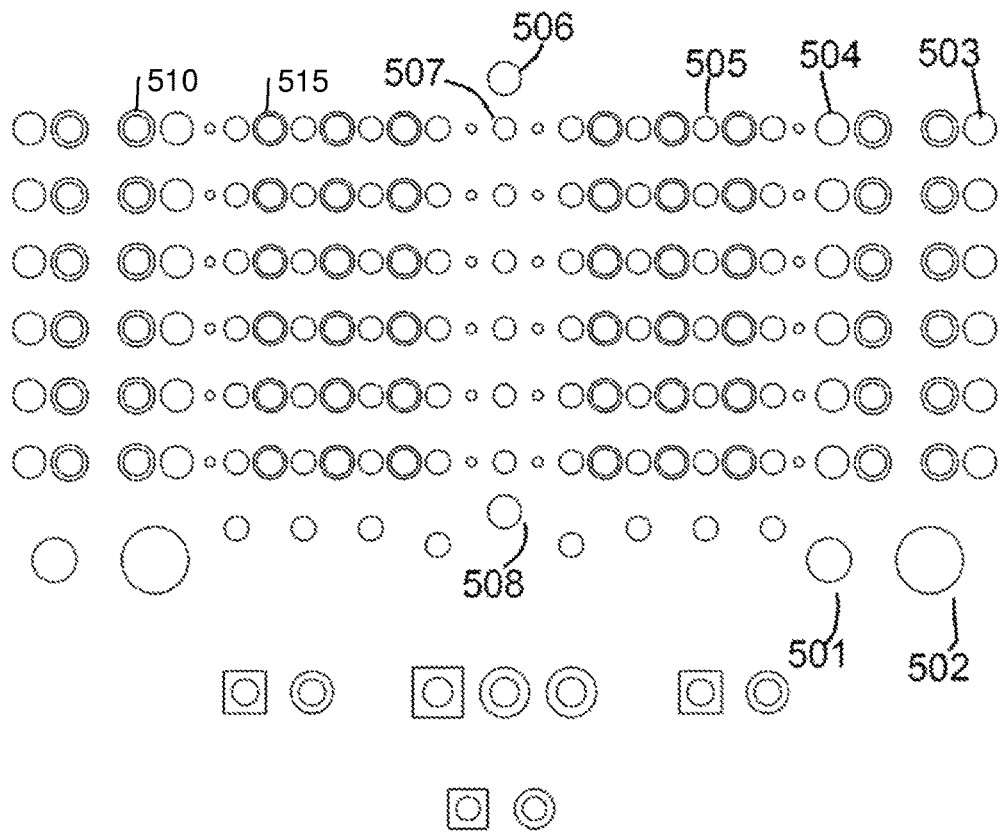
FIG. 5 depicts a top view of a top solder mask according to embodiments in this patent document.

FIG. 5 depicts a top view of a top solder mask according to embodiments in this patent document. FIG. 5 shows an embodiment of a top solder mask layer 500. Signal tie points are depicted with two circles, for example, 510 and 515, and are shown with holes drilled. To avoid cluttering the figure, not all signal tie points are labeled in FIG. 5. In embodiments, solder mask openings 501, 502, 503, 504, 505, 506, 507, 508 for the solder bridges are all circular in shape. Circular mask openings have an advantage for better soldering of solder bridges.

Figure 6:
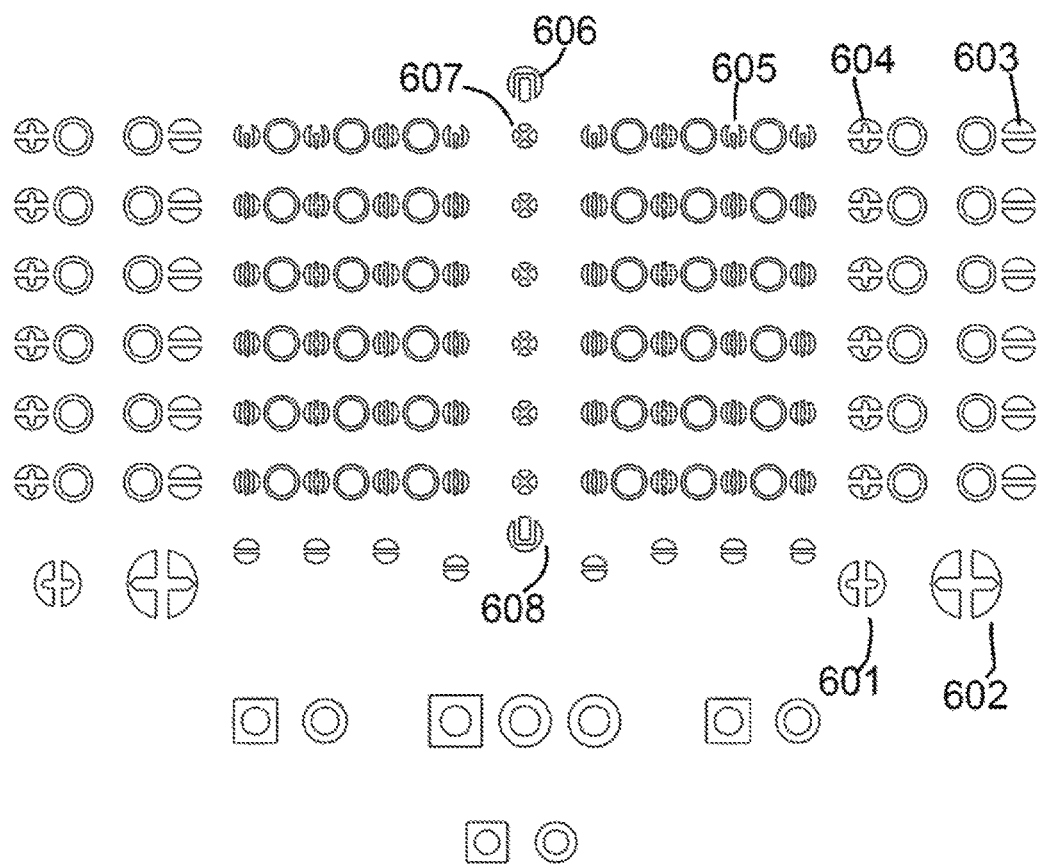
FIG. 6 depicts a top view of a top layer according to embodiments in this patent document.

FIG. 6 depicts a top view of a top layer according to embodiments in this patent document. FIG. 6 shows an embodiment of a top copper layer, as masked by the top solder mask layer. FIG. 6 shows the embodiment shown in FIG. 4 masked by the embodiment shown in FIG. 5, where the solder mask is depicted as fully opaque.

In embodiments, solder bridges 601, 602, 603, 604, 605, 606, 607, and 608, as seen by the user (copper masked by solder mask), are self-documenting. This self-documenting feature is of utility, because the soldering will be done under magnification, and therefore with a narrow field of view. The utility comes in reducing soldering errors. Solder bridge 601, which, when soldered, applies LDO output power to the power rail, looks like a '+' to indicate positive power.

In embodiments, solder bridge 602, which, when soldered, applies input power to power rail, looks like a '+' as well. However, 602 looks bigger than 601, which indicates that 601 is for lower power (e.g. 3.3V), while 602 is for higher power (e.g. 5V). This self-documenting feature helps prevent soldering errors.

In embodiments, solder bridge 603, which grounds the signal tie in the same row looks like a '−' to indicate negative (ground) rail. It is centered in the row. This self-documenting feature helps prevent soldering errors.

In embodiments, solder bridge 604, which joins the signal tie to power rail looks like a '+' This self-documenting feature helps prevent soldering errors.

In embodiments, solder bridge 605 shows how the virtual wire runs within two arcs to its left and right. This self-documenting feature helps prevent soldering errors.

In embodiments, solder bridge 606 looks like a bridge crossing (somewhat like a 'PI' symbol), which indicates how it joins the left and right sides from the top. This self-documenting feature helps prevent soldering errors.

In embodiments, solder bridge 607 looks like an 'x', which indicates its crossing function. This self-documenting feature helps prevent soldering errors.

In embodiments, solder bridge 608 looks like a 'U', or an underground tunnel, which indicates how it joins the left and right side from the bottom. This self-documenting feature helps prevent soldering errors.

Figure 7:
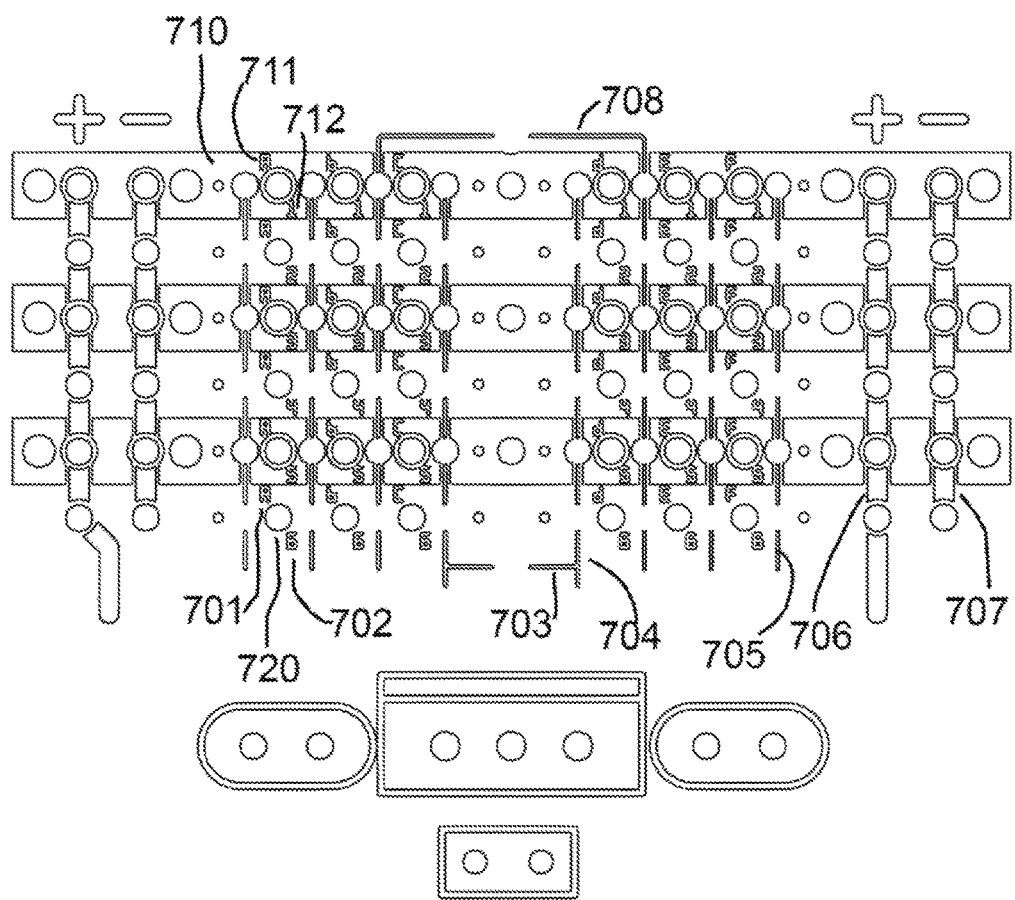
FIG. 7 depicts a top view of a top silkscreen layer according to embodiments in this patent document.

FIG. 7 depicts a top view of a top silkscreen layer according to embodiments in this patent document. In embodiments, field of view coordinates 701, 702, 711, and 712 are used to orient a circuit designer by labeling column and row numbers using alphanumeric characters. In embodiments, alphabetic characters can be used for field of view coordinates indicating columns. For example, the first column can be indicated with the letter A as shown in FIG. 7 with field of view coordinate 701. In embodiments, numeric characters can be used for field of view coordinates indicating rows. For example, the first row can be indicated with the number 1 as shown in FIG. 7 with field of view coordinate 712.

In embodiments, for signal tie point 720, 701 indicates the column it belongs to, and 702 indicates the row it belongs to. Because these field of view coordinates are proximate to 720, they are visible under magnification, within magnification's narrow field of view. The field of view coordinates are of utility, helping to prevent soldering errors. Field of view coordinate 711 is another column coordinate and field of view 712 is another row coordinate.

To avoid cluttering, not all the field of view coordinates in FIG. 7 are labeled. However, in embodiments, each signal tie point can have a field of view coordinate.

In embodiments, connectivity indicators 703, 704, 705, 706, 707, and 708 indicate what wires and buses are on the copper layer. Because it is hard to see through the solder mask, these give some visual indicators as to what wires and buses are on the copper layer 205. Connectivity indicators 706 and 707 give a reminder of the power rail connectivity's on the bottom copper layer 205.

In embodiments, all the connectivity indicators 703, 704, 705, 706, 707, and 708 need not be exactly the same as the copper wires, but give a general indication, enough to reduce or prevent errors.

In embodiments, indicator 710 shows that the row's silkscreen is painted in "reverse video." This row is painted the silkscreen color, then lines are cleared. For example, while column coordinate 701 is painted in silkscreen color, column coordinate 711 is instead the absence of silkscreen color—it is an opening in the silkscreen showing the underlying solder mask color. However, it is surrounded by silkscreen color. Indicator 712 is likewise rendered in "reverse video." The alternating "reverse video" rows allow for easier distinguishing of odd vs. even rows under magnification, and help prevent soldering errors.

Figure 8:
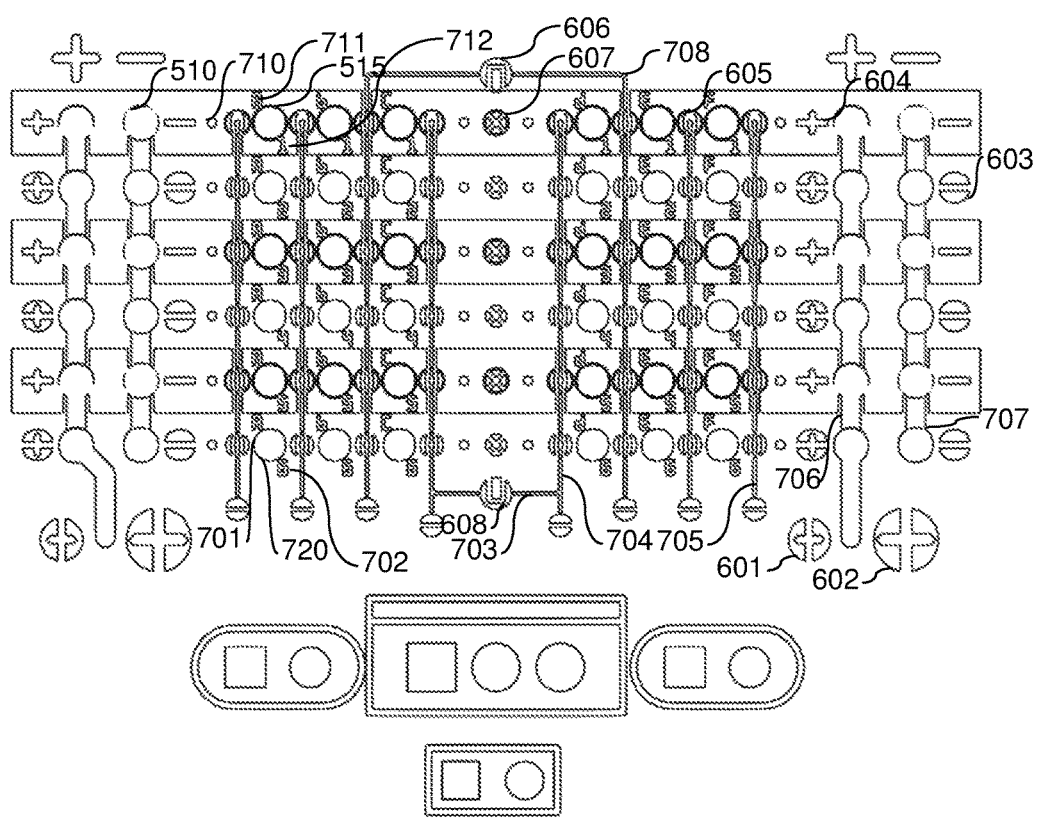
FIG. 8 depicts a top view of a top layer according to embodiments in this patent document.

FIG. 8 depicts a top view of a top layer according to embodiments in this patent document. FIG. 8 shows an embodiment of a top copper layer masked by top solder mask and overlaid with top silkscreen. FIG. 8 shows a composite of the features of embodiments shown in FIGS. 5-7, including features 510 and 515 (described with respect to FIG. 5); features 601, 602, 603, 604, 605, 606, 607, and 608 (described with respect to FIG. 6); and features 701, 702, 703, 704, 705, 706, 710, 711, 712, and 720 (described with respect to FIG. 7). Embodiments described and shown in FIGS. 6-8 are optional and can be used or partially used.

Figure 9:
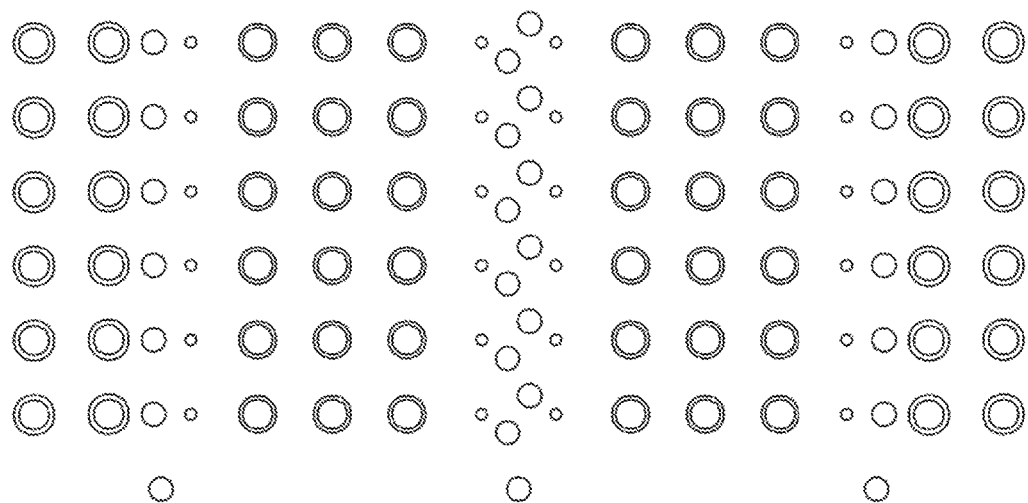
FIG. 9 depicts a top view of a bottom solder mask layer according to embodiments in this patent document.
Figure 9:
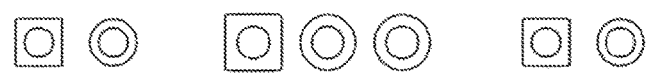
Figure 9:
Figure 10:
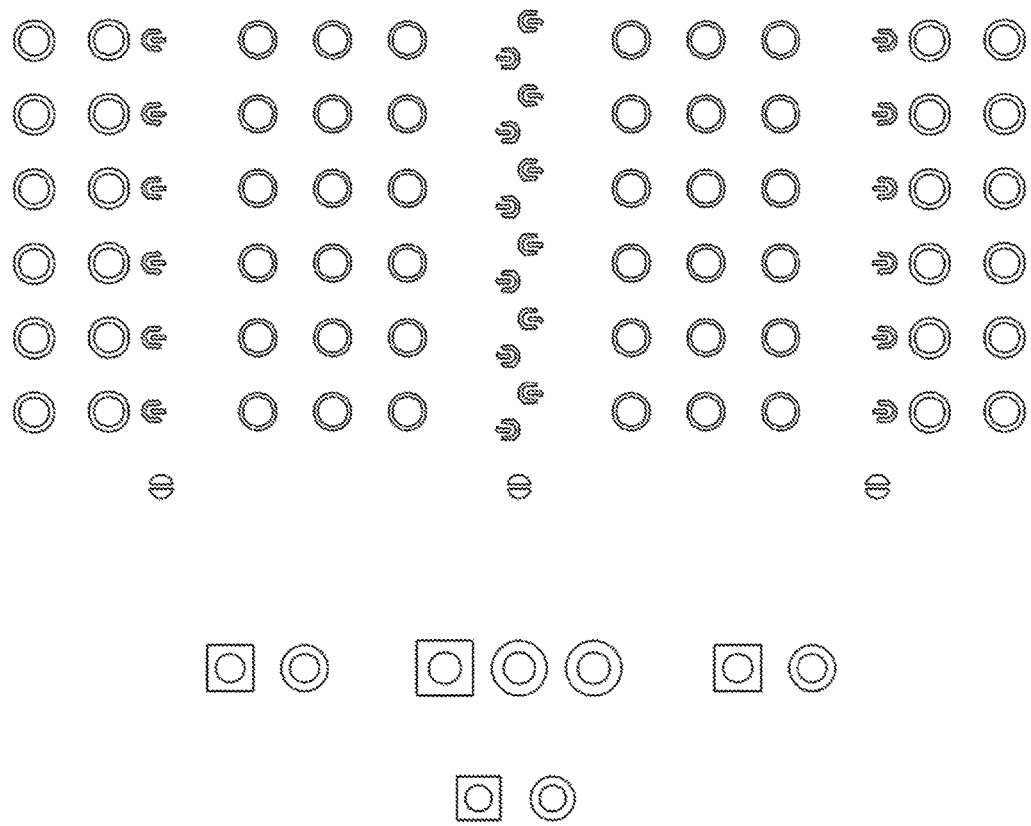
FIG. 10 depicts a top view of a bottom copper layer masked by bottom solder mask according to embodiments in this patent document.
Figure 11:
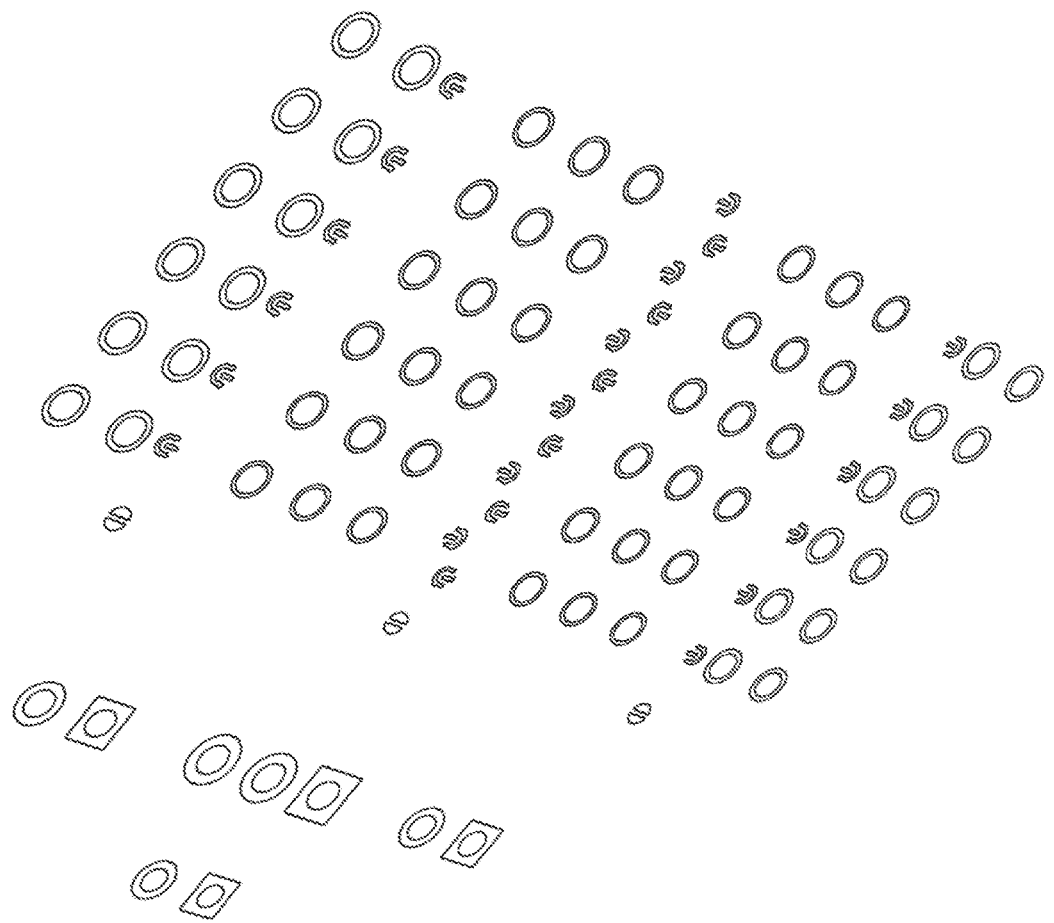
FIG. 11 depicts a perspective view of a bottom copper layer masked by the bottom solder mask according to embodiments in this patent document.

FIG. 9 depicts a top view of a bottom solder mask layer according to embodiments in this patent document. FIG. 9 shows a bottom solder mask, as viewed from the top (e.g. in a computer aided design (CAD) program). FIG. 10 shows an embodiment of a bottom copper layer, masked by the bottom solder mask, as viewed from the top. FIG. 11 shows an embodiment of a bottom copper layer, masked by the bottom solder mask, as viewed from the back, in perspective.

Figure 12:
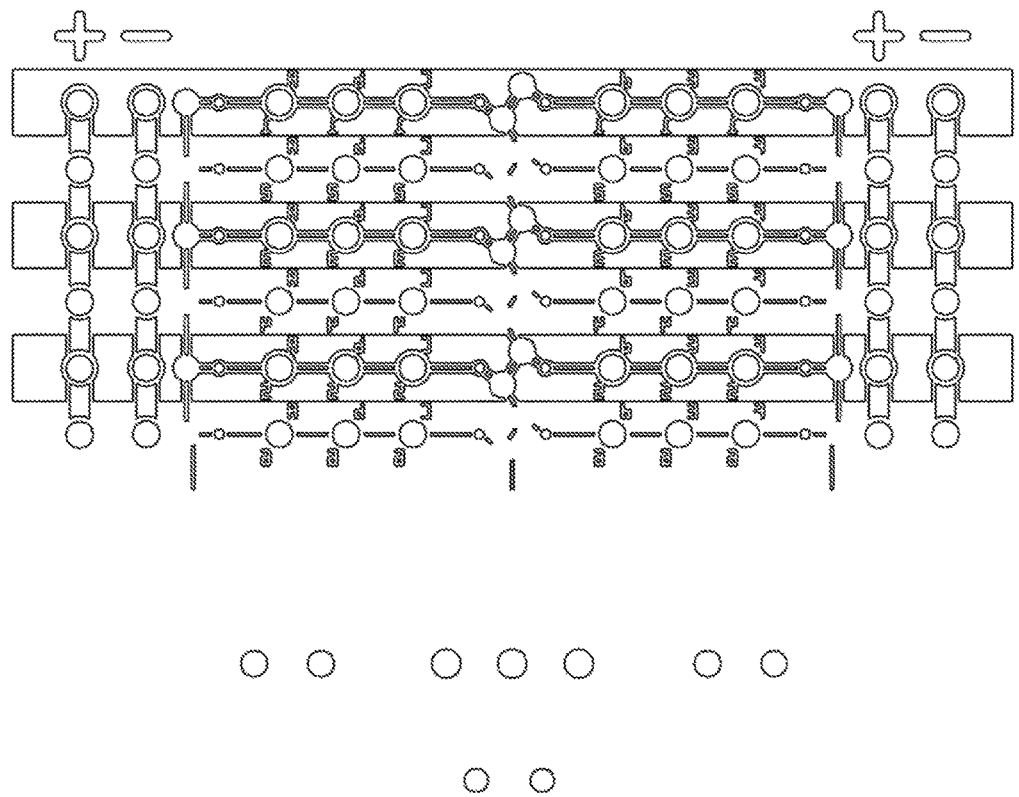
FIG. 12 depicts a top view of a bottom silkscreen layer according to embodiments in this patent document.
Figure 13:
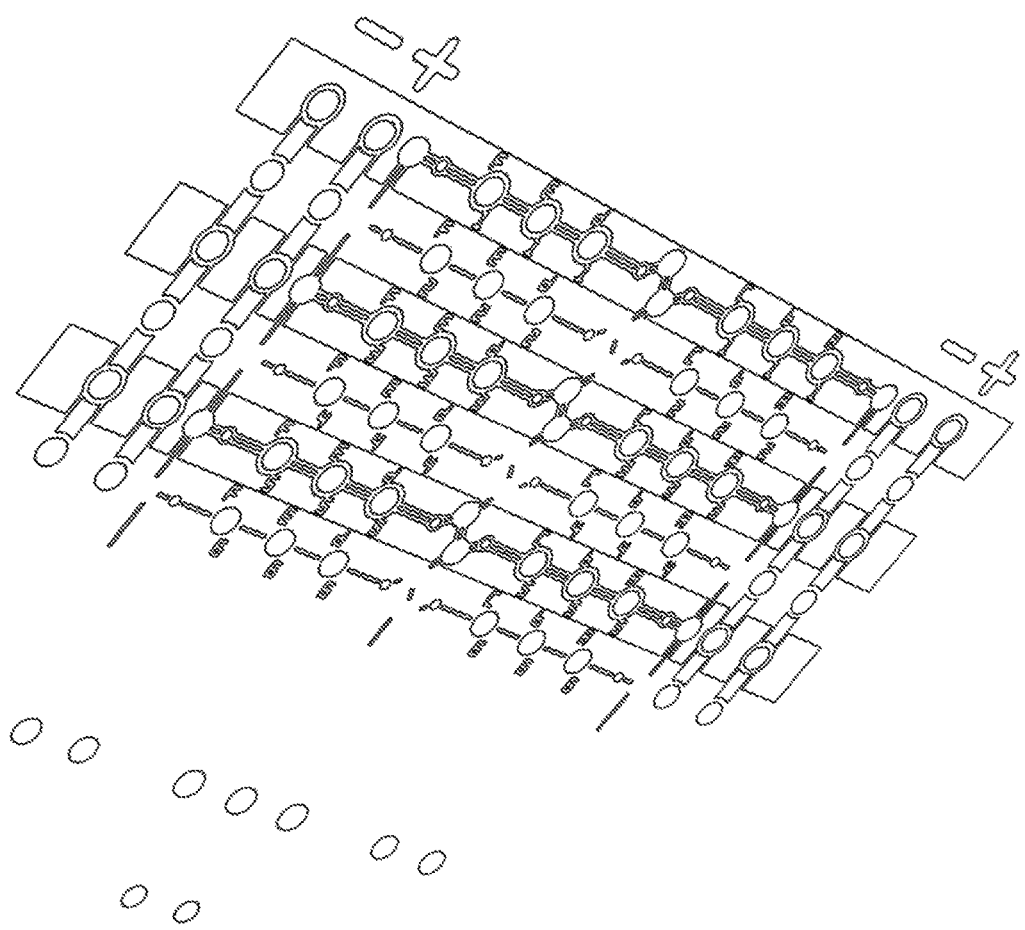
FIG. 13 depicts a back view of a bottom silkscreen layer according to embodiments in this patent document.

FIG. 12 shows an embodiment of a bottom silkscreen layer, as viewed from the top (e.g. in a CAD program). FIG. 13 shows the same embodiment silkscreen as viewed from the back, in perspective.

Figure 14:
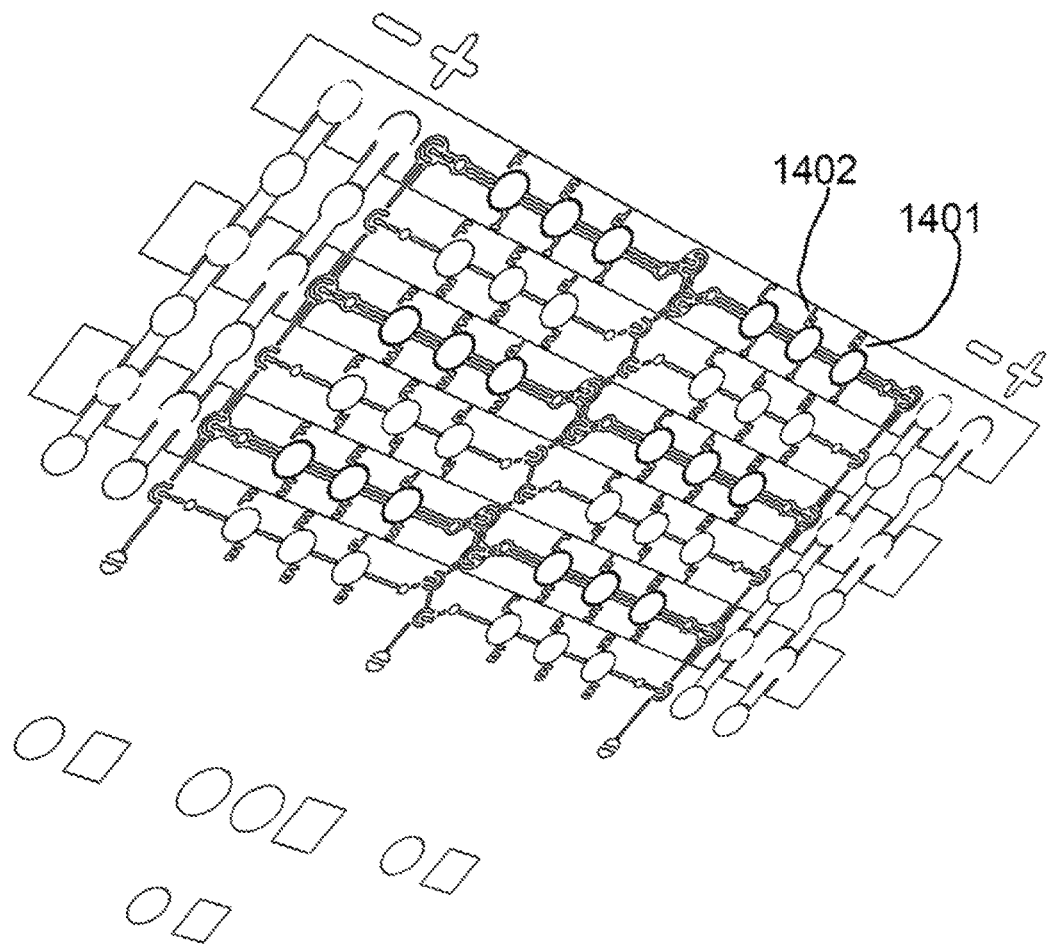
FIG. 14 depicts a back view of a bottom copper layer masked by the bottom solder mask overlaid with bottom silkscreen according to embodiments in this patent document.

FIG. 14 depicts a back view of a bottom copper layer masked by the bottom solder mask overlaid with bottom silkscreen according to embodiments in this patent document. FIG. 14 shows an embodiment of a bottom copper layer, masked by the bottom solder mask layer, and overlaid by a bottom silkscreen layer, as viewed from the back, in perspective. Note that column coordinates 1401 and 1402 are sequenced right to left from this point of view, so that column coordinates always match for a given signal tie point, whether viewed from the front or back. Thus, the silk screened indicators can be viewed from the front or from the back of the PCB. Furthermore, each signal tie point has a single indicator whether viewed from the front or from the back.

Figure 15:
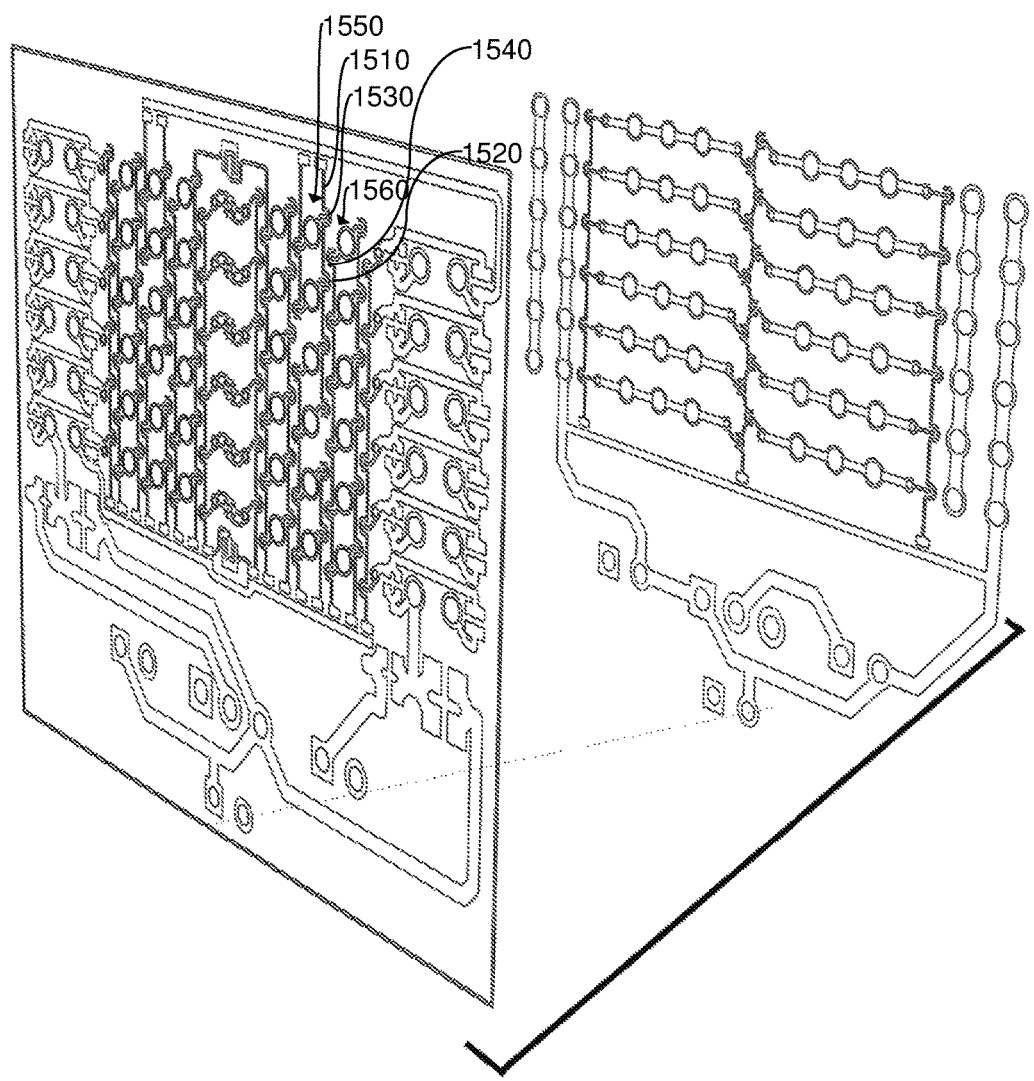
FIG. 15 depicts a perspective view of a top copper layer and a bottom copper layer in exploded view according to embodiments in this patent document.

FIG. 15 depicts a perspective view of a top copper layer and a bottom copper layer in exploded view according to embodiments in this patent document. FIG. 15 shows an embodiment of a top copper (attached to PCB) layer, the PCB, and a bottom copper (exploded) layer in perspective view. FIG. 15 shows an embodiment having two embedded wires 1510 and 1520 between each column of signal tie points. For the sake of explanation only two columns of signal tie points are labeled and only two embedded wires are labeled. However, one of ordinary skill in the art will appreciate that any two columns of signal tie points can be used and one or two or more embedded wires can be inserted in between any two columns of signal tie points. The embodiment shown in FIG. 15 uses two embedded wires in between each column of signal tie points. For ease of explanation, exemplary columns 1550 and 1560 are labeled and embedded wires 1510 and 1520 are labeled. Also shown in FIG. 15 are solder bridges, again only solder bridges 1530 and 1540 are labeled. Solder bridges 1530 and 1540 show the diagonalized feature of the solder bridges. Since, in the embodiment shown in FIG. 15, there are embedded wires on both sides of the columns of signal tie points 1550 and 1560, having diagonalized solder bridges is a more efficient use of the space between the columns 1550 and 1560.

Figure 16:
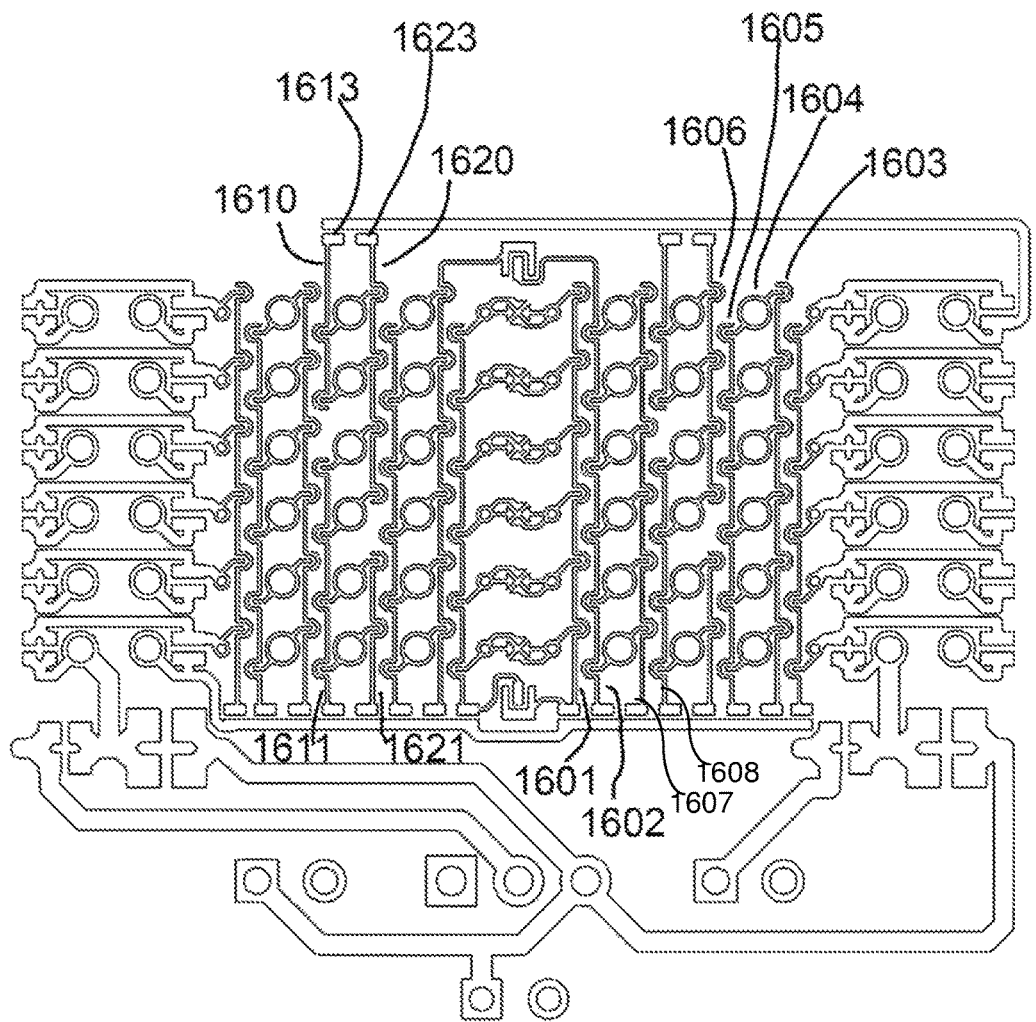
FIG. 16 depicts a top view of a top copper layer according to embodiments in this patent document.

FIG. 16 depicts a top view of a top copper layer according to embodiments in this patent document. In embodiments, embedded wires 1607 and 1608 are both embedded in one column (between sets of signal tie points). In embodiments, two solder bridges 1603 and 1605 are implemented, one on either side of signal tie point 1604. In embodiments, by positioning solder bridges 1603 and 1605 substantially diagonally from each other, tight packing with solder bridges in neighboring columnar space is possible, as seen in tight packing between 1605 and 1606. One of ordinary skill in the art will appreciate that any number of solder bridges and embedded wires can be implemented.

In embodiments, further columnar gap utilization is possible by having embedded wires that do not span the entire height of the signal tie banks. For example, embedded wires 1610 and 1611 are two independent embedded wires that share the same columnar gap. In that example, embedded wires 1610 and 1611 are placed as if one straight wire was cut in the middle. Another example is shown with embedded wires 1620 and 1621. Embedded wires 1610 and 1620 are optimized for wiring localized to the top of the PCB. Whereas, embedded wires 1611 and 1621 are optimized for wiring localized to the bottom of the PCB.

Embedded wires 1610 and 1611 are shown split in a ⅓ to ⅔ manner, while embedded wires 1620 and 1621 are shown split in a ⅔ to ⅓ manner. Using both of these splits allows for overlap in the middle ⅓ of the PCB. This overlap allows for local wiring optimization, while still retaining some global ability. Using both embedded wires 1620 and 1611, a circuit design can run the whole height of the PCB. One of ordinary skill in the art will appreciate that the exact ratios need not be ⅓ to ⅔ and vice versa, but any ratio can be used. However, there is an advantage to providing an overlapping region in certain embodiments.

Since embedded wire 1610 is disconnected from virtual wire 1611, if embedded wire 1610 is left unused (no solder bridges soldered), it will be left floating. Solder bridge 1613 is a sinker, but placed at the top of the board, to allow easy tying of embedded wire 1610 to ground if it is left unconnected to signal tie points. Solder bridge 1623 is a sinker for embedded wire 1620, in case 1620 is left unconnected to signal tie points.

Figure 17:
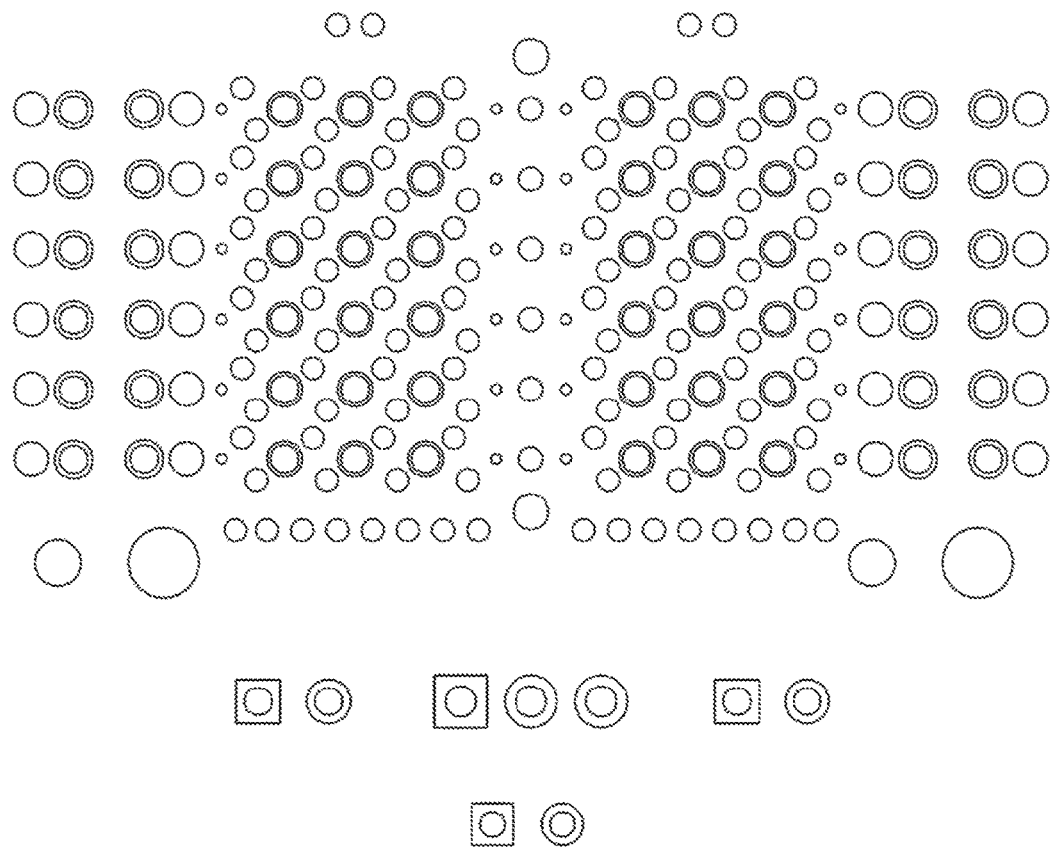
FIG. 17 depicts a top view of a top solder mask layer according to embodiments in this patent document.

FIG. 17 depicts a top view of a top solder mask layer according to embodiments in this patent document. FIG. 17 is an embodiment of a top solder mask for the embodiment shown in FIG. 16, as viewed from the top.

Figure 18:
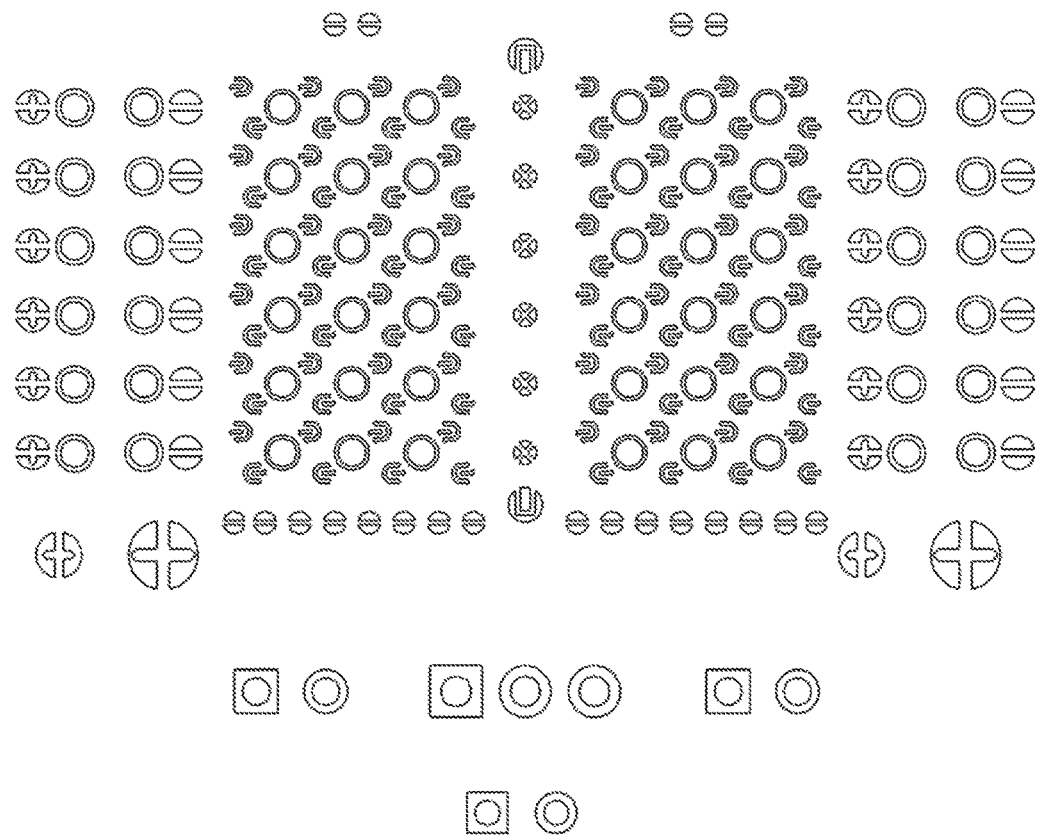
FIG. 18 depicts a top view of a top copper layer masked by a top solder mask layer according to embodiments in this patent document.

FIG. 18 depicts a top view of a top copper layer masked by a top solder mask layer according to embodiments in this patent document. FIG. 18 is an embodiment shown in FIG. 16 of a top copper layer masked by top solder mask layer, as viewed from the top. In embodiments, the solder bridges are self-documenting.

Figure 19:
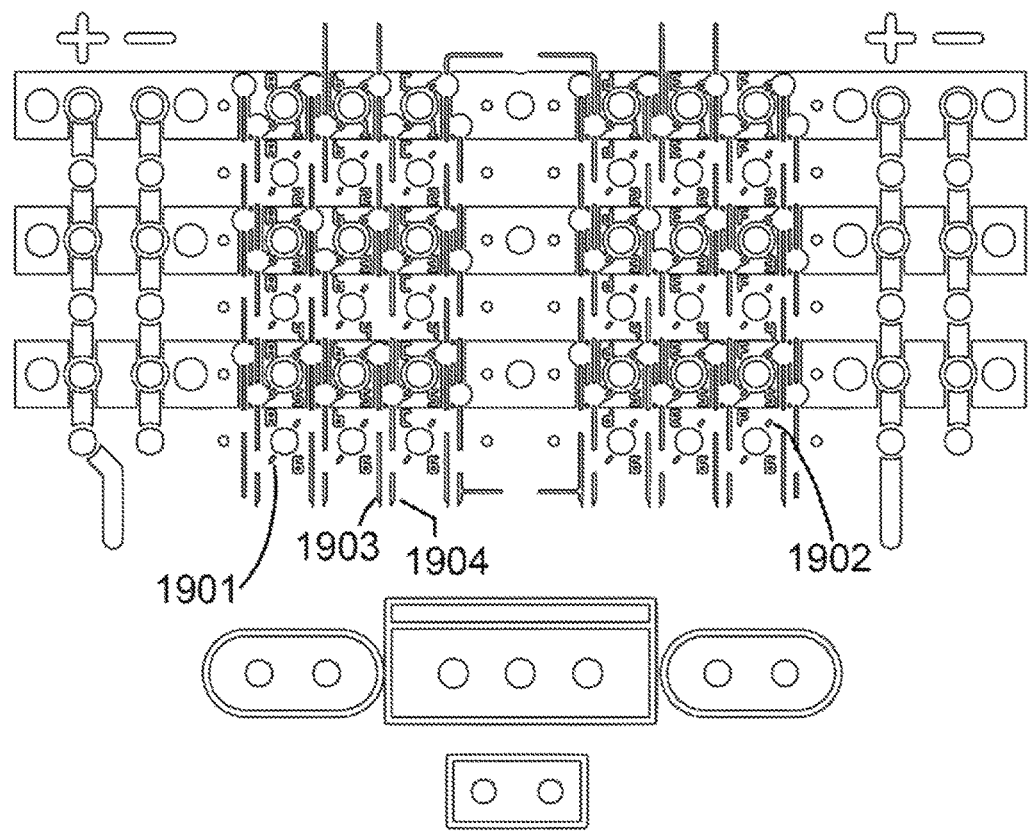
FIG. 19 depicts a top view of a top silkscreen layer according to embodiments in this patent document.

FIG. 19 depicts a top view of a top silkscreen layer according to embodiments in this patent document. FIG. 19 is an embodiment of a top silkscreen layer for an advanced style of my invention, as viewed from the top:

In embodiments, connectivity indicators 1901 and 1902 are used for diagonal connectivity indicators.

In embodiments, embedded wire connectivity indicators 1903 and 1904 are packed more densely than in the embodiment shown in FIG. 2.

Figure 20:
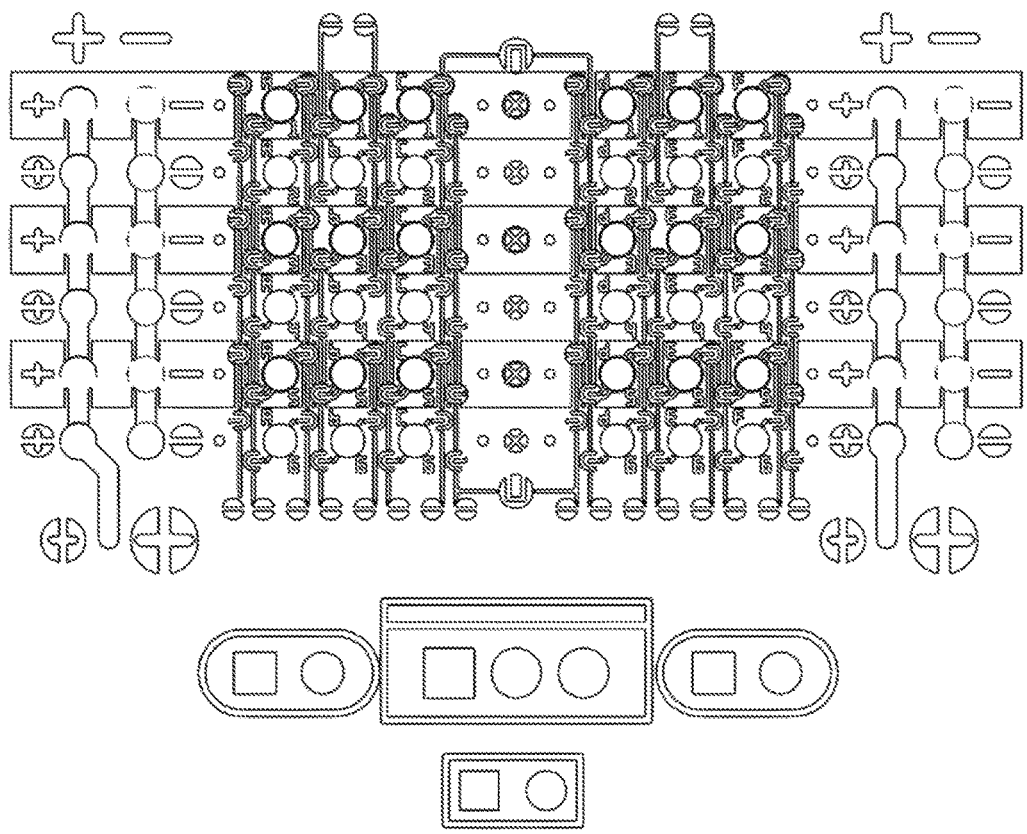
FIG. 20 depicts a top view of a top copper layer masked by a top solder mask layer, overlaid with a top silkscreen according to embodiments in this patent document.

FIG. 20 depicts a top view of a top copper layer masked by a top solder mask layer, overlaid with a top silkscreen according to embodiments in this patent document. FIG. 20 shows an embodiment of a top copper layer masked by a top solder mask, and overlaid with a top silkscreen, as viewed from the top.

The bottom copper, bottom solder mask, and bottom silkscreen layers can be exactly the same as those described with respect to FIGS. 2-14.

Figure 21:
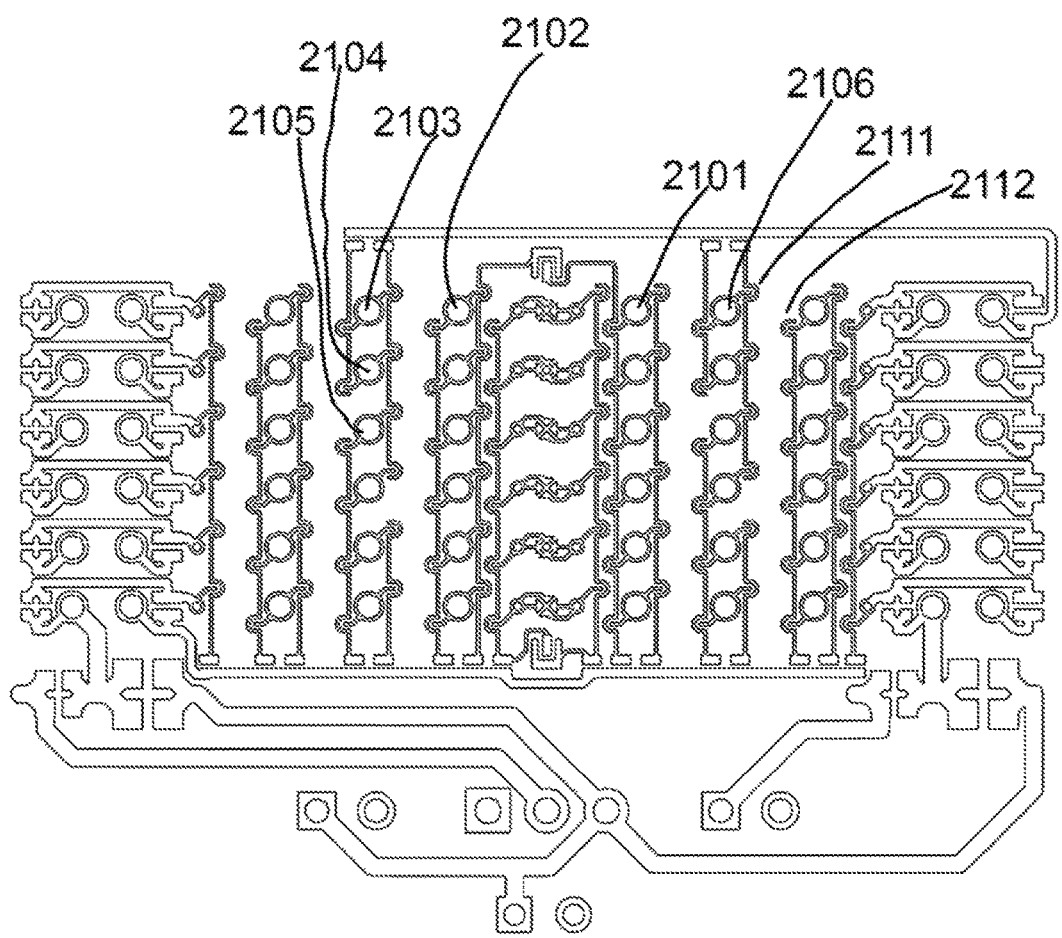
FIG. 21 depicts a top view of a top copper layer according to embodiments in this patent document.

FIG. 21 depicts a top view of a top copper layer according to embodiments in this patent document. FIG. 21 shows an embodiment of a top copper layer, as viewed from the top. It is similar to the embodiments shown in FIG. 16, but it is wider.

Typical breadboard-style PCBs use uniform row and column spacing between signal tie points. In this wide style, the row-to-row spacing and column-to-column spacing between signal tie points differ. Typical breadboard-style PCBs use a spacing of 0.1" between rows and 0.1" between columns. One possible implementation of the wide style of my invention uses 0.15" spacing between columns, and 0.1" spacing between rows.

2101 and 2102 continue to be spaced 0.3" apart. This allows 0.3" dual inline package integrated circuits (DIP ICs) (not shown) to continue to be plugged in to the innermost signal tie points—e.g. the top pins of the IC may be in 2101 and 2102.

In embodiments, signal tie points 2102 and 2103 are spaced 0.15" apart. However, signal tie points 2103 and 2104 are spaced 0.1" apart, as are signal tie points 2104 and 2105. Vertically, there is no difference between the wide style board and traditional boards, so something like a TO-220 (not shown) can be plugged into signal tie points 2103, 2104, and 2105. In embodiments, signal tie points 2101 and 2106 are also 0.15" apart.

Thus, in embodiments signal tie points 2103 and 2106 can be 0.6" apart. This spacing allows for 0.6" DIP ICs (not shown) to continue to be used with this board—e.g. the top pins of a 0.6" DIP IC may be in 2103 and 2106.

This spacing scheme allows for the more numerous embedded wires between signal tie points, but leaves more spacing between solder bridges 2111 and 2112. This layout is good for people with not-as-steady hands when soldering, or people who have presbyopia.

Figure 22:
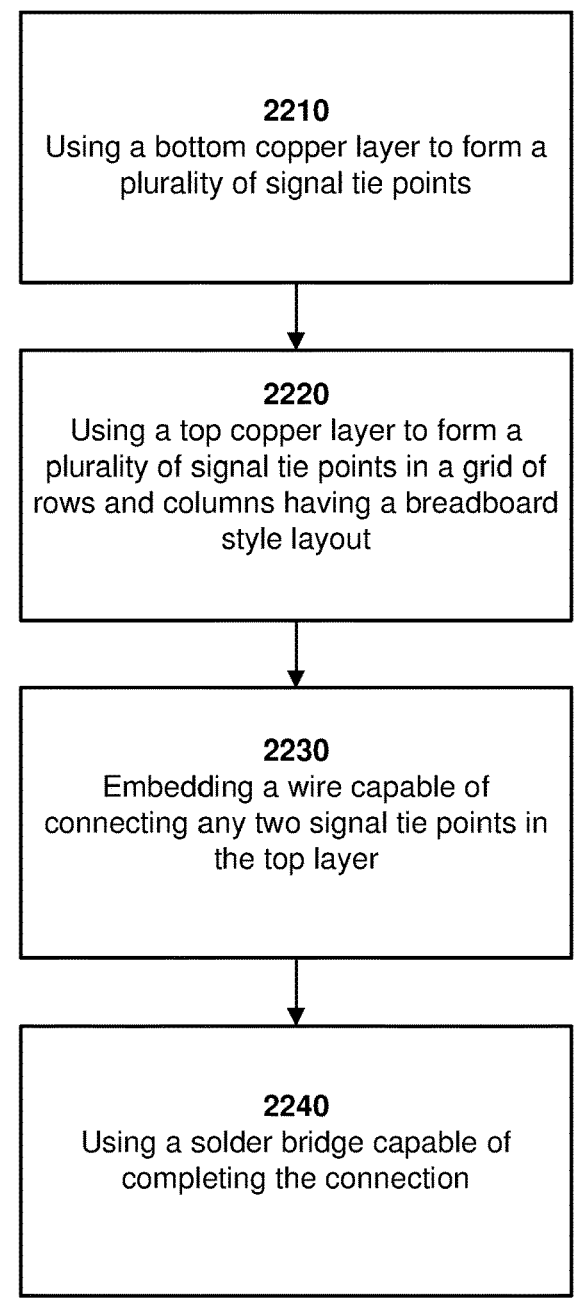
FIG. 22 depicts a flow chart according to embodiments in this patent document.

FIG. 22 depicts a flow chart according to embodiments in this patent document. FIG. 22 shows using a bottom copper layer to form a plurality of signal tie points 2210, using a top copper layer to form a plurality of signal tie points in a grid of rows and columns having a breadboard style layout 2220, embedding a wire capable of connecting any two signal tie points in the top layer 2230, and using a solder bridge capable of completing the connection 2240. As described above, the bottom copper layer forms a plurality of signal tie points in a grid having a left portion of each row connected to the other PTHs in the left portion of the row and similar for the right portion. However, the signal tie points within columns are not connected. A copper trace can be used in the top layer to implement an embedded wire on the top copper layer. The embedded wire can be used to connect any two signal tie points by use of a solder bridge.

A stencil can be used to solder one or more solder bridges. The stencil can be created by hand or by a computer using a program to generate a stencil that will result in a particular circuit being generated. A stencil is particularly useful to aid in the soldering and reduce the likelihood of soldering error. In embodiments, planning software can be used to generate a particular circuit by: 1. printing a list of solder bridges to solder manually, 2. automatically generate a list of sink bridges that one might consider soldering so that unused embedded wires will not be left floating, and/or 3. automatically generate a list of unused signal ties that a designer should consider tying to ground (using ground bridges) so the signal ties will not be left floating.

In embodiments, software can be implemented to automatically generate a test plan as to what signal ties should have connectivity tested with a multi-meter after soldering. This plan generates both positive tests and negative tests—e.g. "Rows 1 and 2 on the left signal bank should be connected, but rows 5 and 6 on the left signal bank should not show a connection."

In embodiments, software can be used to generate a cut file for die cutters such as Silhouette Portrait/Cameo or Cricut. One of ordinary skill in the art will appreciate that any die cutter can be used. This cut file can be a DXF file that can be imported into the software of the cutter (e.g. DXF file imported into Silhouette Studio). In embodiments, this cut file can then be used to cut a stencil, such as a Mylar stencil, or a Polyimide/Kapton Stencil. In embodiments, this cut file will have openings only for the solder bridges that need to be soldered. In embodiments, a squeegee can be used to apply solder paste via the stencil.

Alternatively, the cut file in can be considered a guide. Guides are similar to stencils but can have slightly bigger or slightly smaller holes. When cut on paper, it can be a simple guide for manual application of solder paste with a syringe. When cut on Mylar or Polyimide, a guide can be overlaid on a steel stencil. In embodiments, the steel stencil can have openings for every solder bridge on the board, regardless of whether the solder bridge is to be soldered.

In embodiments, the guide, when laid on top of the steel stencil, closes some of these holes. In embodiments, a squeegee is used to apply solder paste through the guide and stencil.

Figure 23:
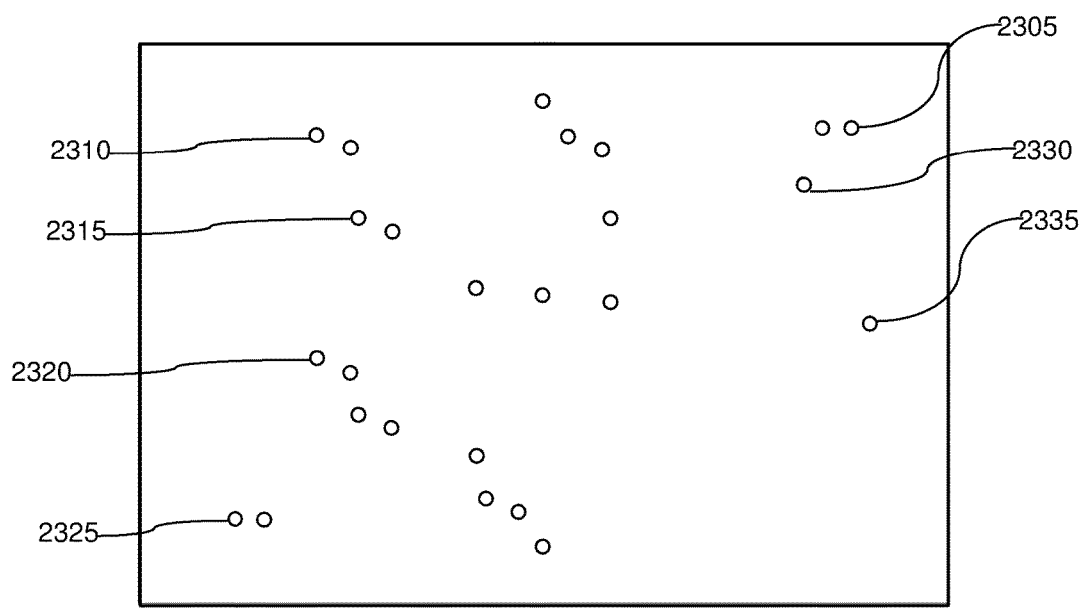
FIG. 23 depicts a stencil according to embodiments in this patent document.

FIG. 23 depicts a stencil according to embodiments in this patent document. FIG. 23 shows stencil 2300 including holes 2305, 2310, 2315, 2320, 2325, 2330, and 2335. Holes 2305, 2310, 2315, 2320, 2325, 2330, and 2335 indicate where solder should be applied to achieve a particular circuit. For ease of explanation, not all the holes have been labeled in the figure. One of ordinary skill in the art will understand that the holes are appropriately placed to achieve a particular circuit and can be placed at any point to achieve a desired result. Using the stencil makes soldering the appropriate solder bridges easier and error free.

The FIGS. 2-21 show PCBs with 6 rows and 3 columns of signal tie points on each bank (2 banks, left, and right). However, one of ordinary skill in the art will appreciate that this size choice was used for ease of explanation and is not intended to be limiting.

For example, embodiments can have any number of rows and columns of signal tie points. Some likely number of rows and columns are 15 rows of 5 columns of signal tie points on each bank (2 banks), 30 rows of 5 columns of signal tie points on each bank (2 banks), and 60 rows of 5 columns of signal tie points on each bank (2 banks). However, these examples are also not intended to be limiting. Any size can be used.

Embodiments in this patent document show an improved PCB that reduces or eliminates the need for hookup wires.

One of ordinary skill in the art will appreciate that various benefits are available as a result of the present invention.

Embodiments of the present invention may be encoded upon one or more non-transitory computer-readable media with instructions for one or more processors or processing units to cause steps to be performed. It shall be noted that the one or more non-transitory computer-readable media shall include volatile and non-volatile memory. It shall be noted that alternative implementations are possible, including a hardware implementation or a software/hardware implementation. Hardware-implemented functions may be realized using ASIC(s), programmable arrays, digital signal processing circuitry, or the like. Accordingly, the "means" terms in any claims are intended to cover both software and hardware implementations. Similarly, the term "computer-readable medium or media" as used herein includes software and/or hardware having a program of instructions embodied thereon, or a combination thereof. With these implementation alternatives in mind, it is to be understood that the figures and accompanying description provide the functional information one skilled in the art would require to write program code (i.e., software) and/or to fabricate circuits (i.e., hardware) to perform the processing required.

It shall be noted that embodiments of the present invention may further relate to computer products with a non-transitory, tangible computer-readable medium that have computer code thereon for performing various computer-implemented operations. The media and computer code may be those specially designed and constructed for the purposes of the present invention, or they may be of the kind known or available to those having skill in the relevant arts. Examples of tangible computer-readable media include, but are not limited to: magnetic media such as hard disks, floppy disks, and magnetic tape; optical media such as CD-ROMs and holographic devices; magneto-optical media; and hardware devices that are specially configured to store or to store and execute program code, such as application specific integrated circuits (ASICs), programmable logic devices (PLDs), flash memory devices, and ROM and RAM devices. Examples of computer code include machine code, such as produced by a compiler, and files containing higher level code that are executed by a computer using an interpreter. Embodiments of the present invention may be implemented in whole or in part as machine-executable instructions that may be in program modules that are executed by a processing device. Examples of program modules include libraries, programs, routines, objects, components, and data structures. In distributed computing environments, program modules may be physically located in settings that are local, remote, or both.

One skilled in the art will recognize no computing system or programming language is critical to the practice of the present invention. One skilled in the art will also recognize that a number of the elements described above may be physically and/or functionally separated into sub-modules or combined together.

It will be appreciated to those skilled in the art that the preceding examples and embodiment are exemplary and not limiting to the scope of the present invention. It is intended that all permutations, enhancements, equivalents, combinations, and improvements thereto that are apparent to those skilled in the art upon a reading of the specification and a study of the drawings are included within the true spirit and scope of the present invention.

What is claimed is:

1. A breadboard style printed circuit board (PCB) system, comprising:

a printed circuit board having a first copper layer and a second copper layer;

a first plurality of signal tie points forming a plurality of columns and a plurality of rows, the first plurality of signal tie points on the first copper layer, wherein each signal tie point in a left portion of a row is electrically coupled to each signal tie point in the left portion of the row and each signal tie point in the right portion of the row is electrically coupled to each signal tie point in the right portion of the row;

a second plurality of signal tie points forming a plurality of columns and a plurality of rows, the second plurality of signal tie points on the second copper layer, wherein each signal tie point in the second copper layer has a corresponding signal tie point in the first copper layer;

an electrical connection between the first signal tie points in the first copper layer and corresponding second signal tie points in the second copper layer;

a plurality of power rails arranged vertically;

a plurality of embedded wires, formed from a plurality of copper structures, between each of the plurality of columns and the plurality of rows, the plurality of embedded wires capable of connecting any two signal tie points on the first copper layer, wherein the connection is made once the electrical connection is completed; and a plurality of solder bridges between each of the plurality of columns and the plurality of rows, the plurality of solder bridges capable of receiving solder to complete the electrical connection and form an electrical connection with the embedded wire to form bread board style connections on the PCB.

2. The system of claim 1 wherein the embedded wire is implemented as a copper layer on the second layer.

3. The system of claim 1 wherein the embedded wire is capable of making an electrical connection between any two signal tie points.

4. The system of claim 1 wherein the embedded wire is capable of connecting a power rail to a signal tie point.

5. The system of claim 1 wherein the embedded wire is capable of connecting an entire column of signal tie points.

6. The system of claim 1 wherein the embedded wire is capable of forming a global bus.

7. The system of claim 1 further comprising a field of view coordinate indicating a row and a column for a signal tie point.

8. The system of claim 1 further comprising a connectivity indicator showing where the embedded wires are in the copper first layer.

9. The system of claim 1 wherein the embedded wire is capable of being grounded.

10. A printed circuit board (PCB) system, the system comprising: a printed circuit board having a first copper layer and a second copper layer; a first plurality of signal tie points forming a plurality of columns and a plurality of rows, the first plurality of signal tie points on the first copper layer, wherein each signal tie point in a left portion of a row is electrically coupled to each signal tie point in the left portion of the row and each signal tie point in a right portion of the row is electrically coupled to each signal tie point in the right portion of the row; a second plurality of signal tie points forming a second plurality of columns and a plurality of rows on the second copper layer, wherein each signal tie point in the second copper layer has a corresponding signal tie point in the first copper layer; an electrical connection between signal tie points in the first layer and corresponding signal tie points in the second copper layer; a plurality of power rails arranged vertically; a plurality of embedded wires, formed from a plurality of copper structures, between each of the plurality of columns and the plurality of rows, the plurality of embedded wires capable of connecting any two signal tie points on the first layer, wherein the connection is made once the electrical connection is completed; a plurality of solder bridges between each of the plurality of columns and the plurality of rows, the plurality of solder bridges capable of receiving solder to complete the electrical connection and form an electrical connection with the embedded wire; and a stencil capable of exposing a plurality of solder bridges, wherein the soldering the exposed solder bridges forms a particular set of connections to form a breadboard style set of connections on the PCB.

11. The system of claim 10 wherein the stencil is computer generated.

12. The system of claim 10 wherein the stencil is used to solder a specific solder bridge.

* * * * *